(12) United States Patent
Nagai

(10) Patent No.: US 7,969,008 B2
(45) Date of Patent: Jun. 28, 2011

(54) SEMICONDUCTOR DEVICE WITH IMPROVED PADS

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 576 days.

(21) Appl. No.: 12/163,340

(22) Filed: Jun. 27, 2008

(65) Prior Publication Data

US 2008/0258262 A1 Oct. 23, 2008

Related U.S. Application Data

(63) Continuation of application No. PCT/JP2005/023965, filed on Dec. 27, 2005.

(51) Int. Cl.
*H01L 23/48* (2006.01)

(52) U.S. Cl. ............... 257/758; 257/E21.649; 257/774; 257/306; 438/622

(58) Field of Classification Search .............. 438/396, 438/618, 622; 257/306, 758, 774, E21.649, 257/E21.009, E21.664, E23.145, E23.151
See application file for complete search history.

(56) References Cited

U.S. PATENT DOCUMENTS

| 6,455,882 | B1 * | 9/2002 | Nakura | 257/295 |
| 6,492,222 | B1 * | 12/2002 | Xing | 438/240 |
| 2002/0125577 | A1 | 9/2002 | Komada | |
| 2003/0102500 | A1 | 6/2003 | Cross | |
| 2004/0150070 | A1 | 8/2004 | Okada et al. | |
| 2005/0082577 | A1 | 4/2005 | Usui | |
| 2005/0127395 | A1 | 6/2005 | Saigoh et al. | |

FOREIGN PATENT DOCUMENTS

| JP | 2002-270608 A | 9/2002 |
| JP | 2002-289689 A | 10/2002 |
| JP | 2003-174146 A | 6/2003 |
| JP | 2004-134450 A | 4/2004 |
| JP | 2004-297022 A | 10/2004 |
| JP | 2005-142553 A | 6/2005 |
| JP | 2005-175204 A | 6/2005 |

OTHER PUBLICATIONS

International Search Report of PCT/JP2005/023965, date of mailing Apr. 18, 2006.

* cited by examiner

*Primary Examiner* — David Vu
(74) *Attorney, Agent, or Firm* — Westerman, Hattori, Daniels & Adrian, LLP

(57) ABSTRACT

A semiconductor device has: a circuit portion having semiconductor elements formed on a semiconductor substrate; insulating lamination formed above the semiconductor substrate and covering the circuit portion; a multilevel wiring structure formed in the insulating lamination and including wiring patterns and via conductors; and a pad electrode structure formed above the semiconductor substrate and connected to the multilevel wiring structure. The pad electrode structure includes pad wiring patterns and pad via conductors interconnecting the pad wiring patterns, the uppermost pad wiring pattern includes a pad pattern and a sealing pattern surrounding the pad pattern in a loop shape. Another pad wiring pattern has continuous extended pad pattern of a size overlapping the sealing pattern. The pad via conductors include a plurality of columnar via conductors disposed in register with the pad pattern and a loop-shaped wall portion disposed in register with the sealing pattern.

20 Claims, 24 Drawing Sheets

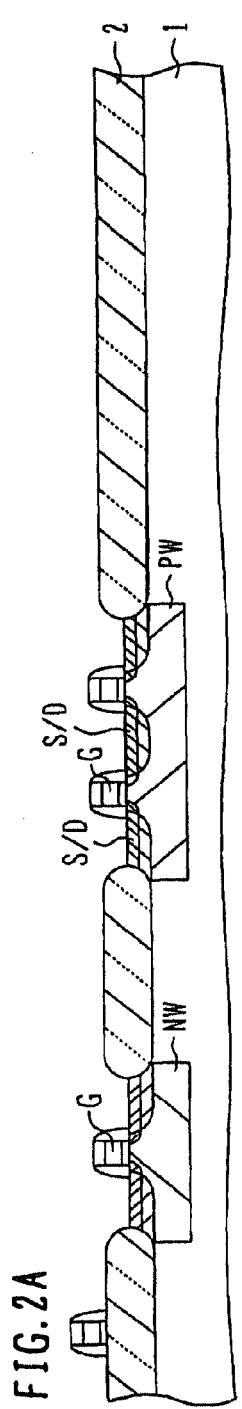
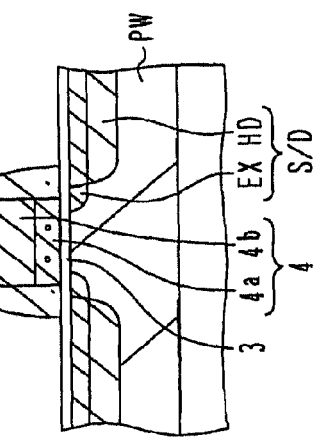
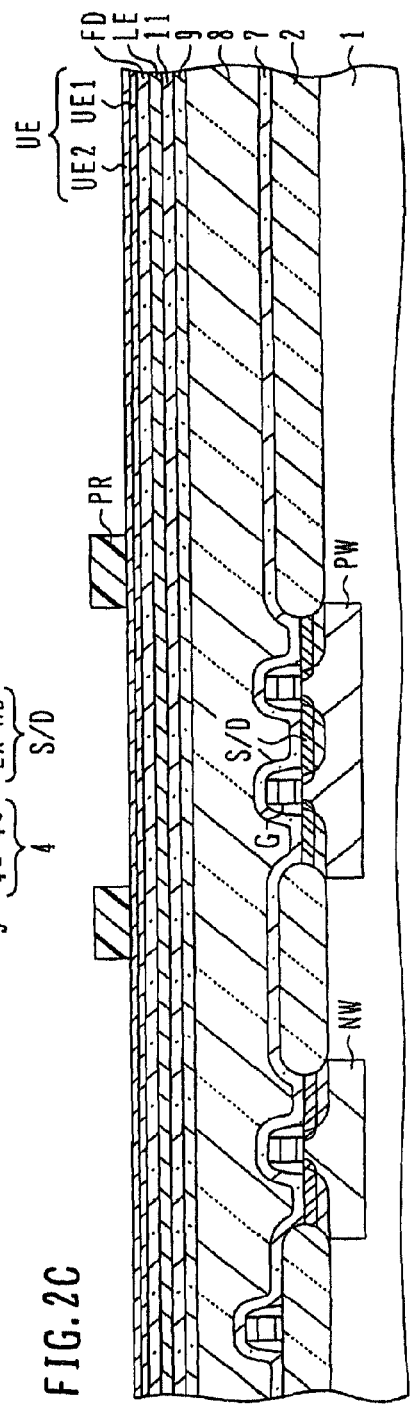
FIG. 2A
FIG. 2B
FIG. 2C

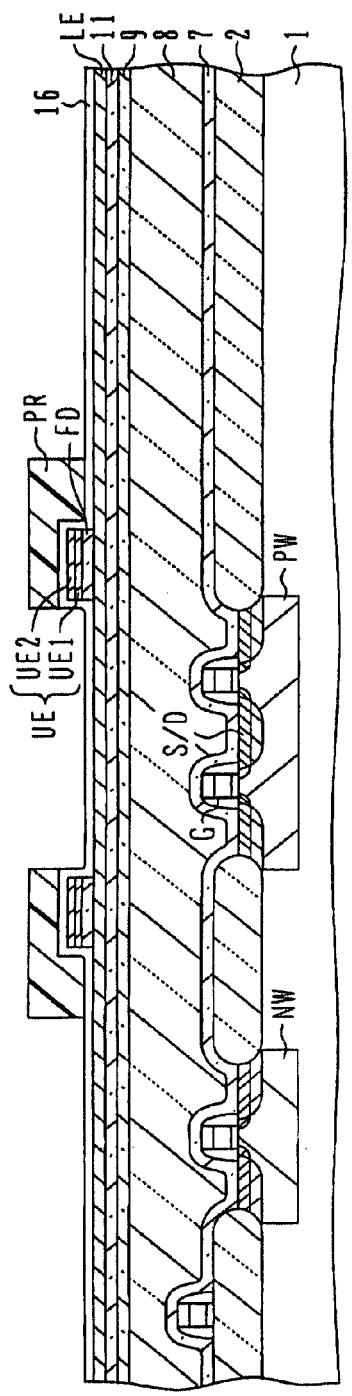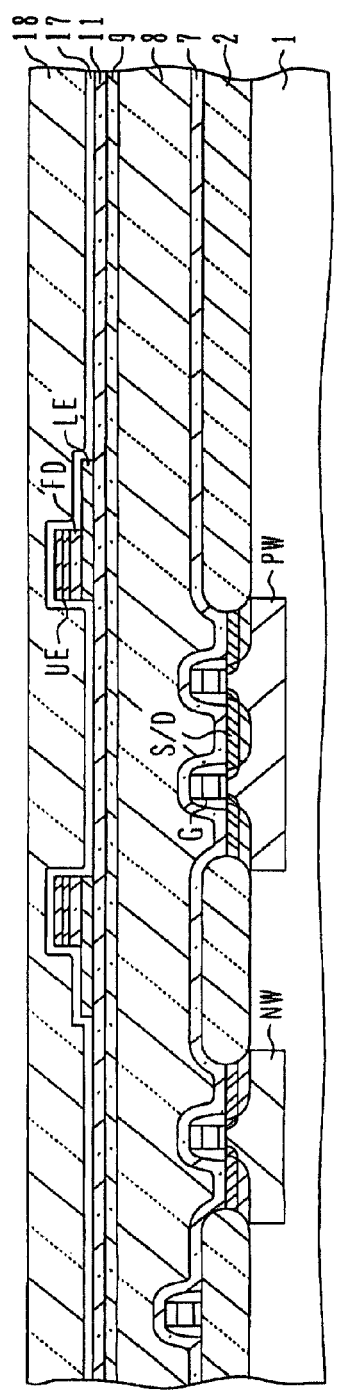

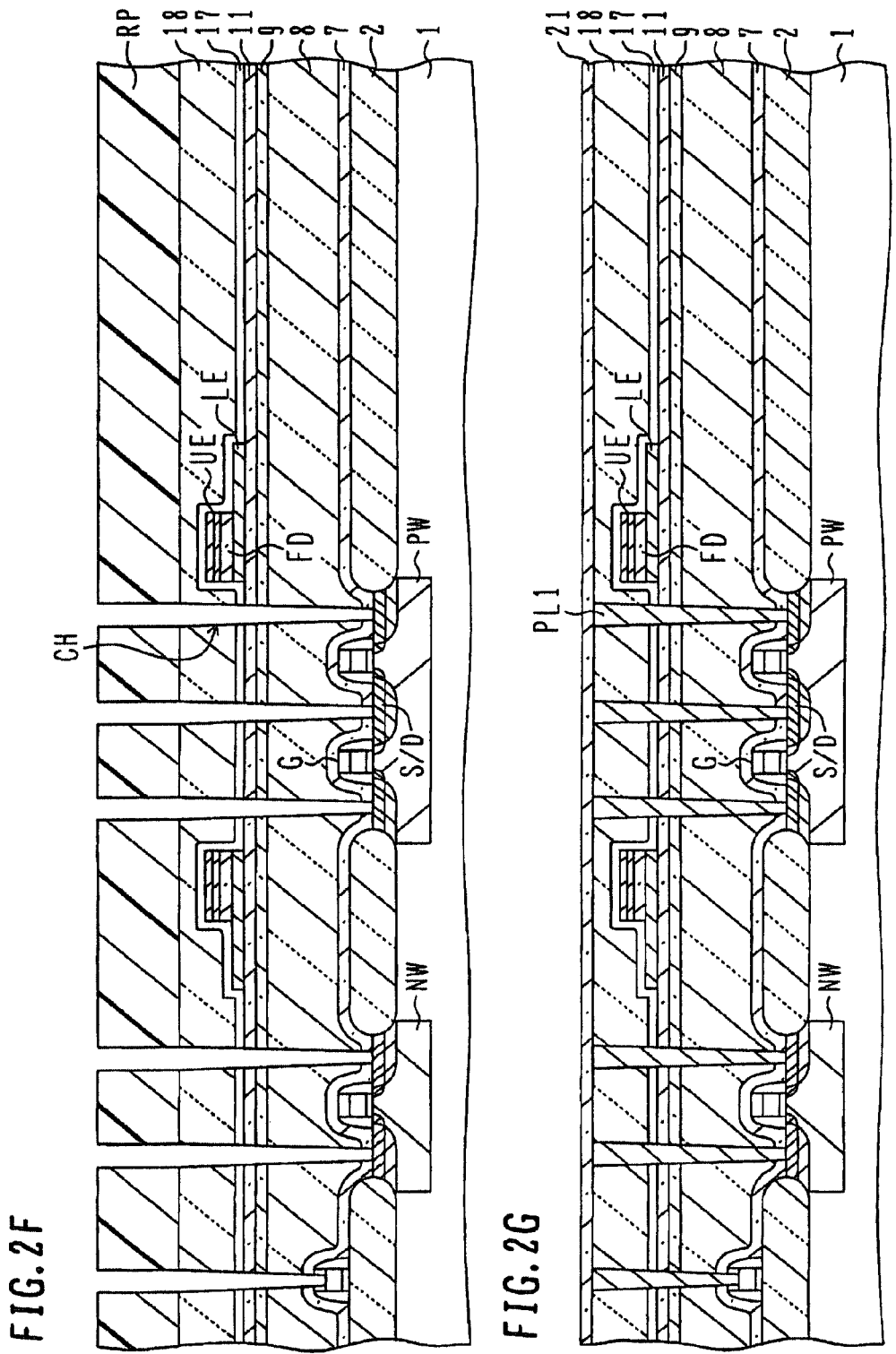

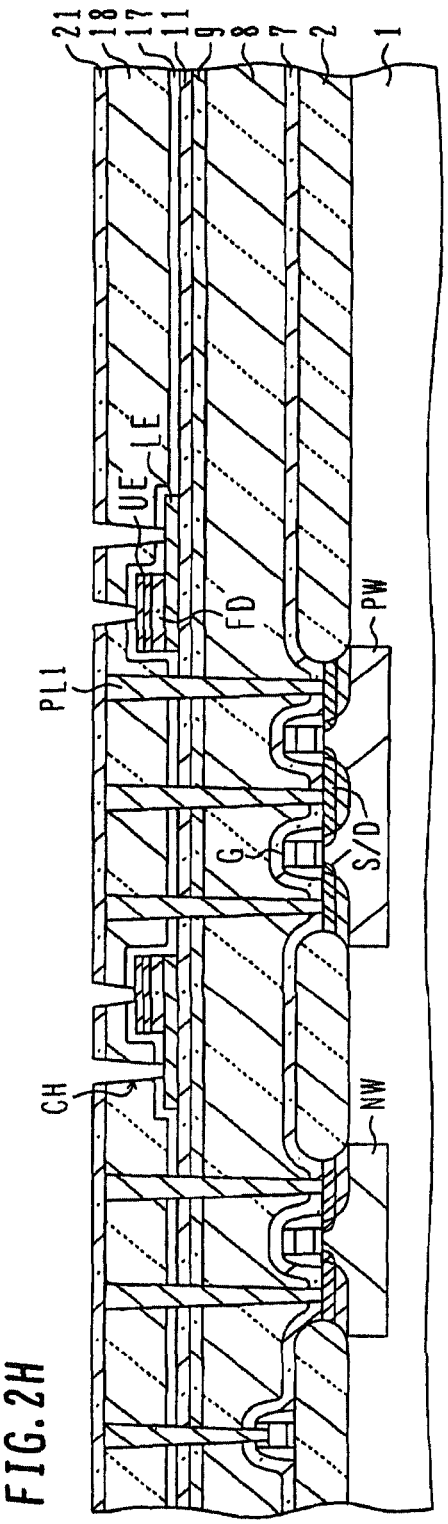
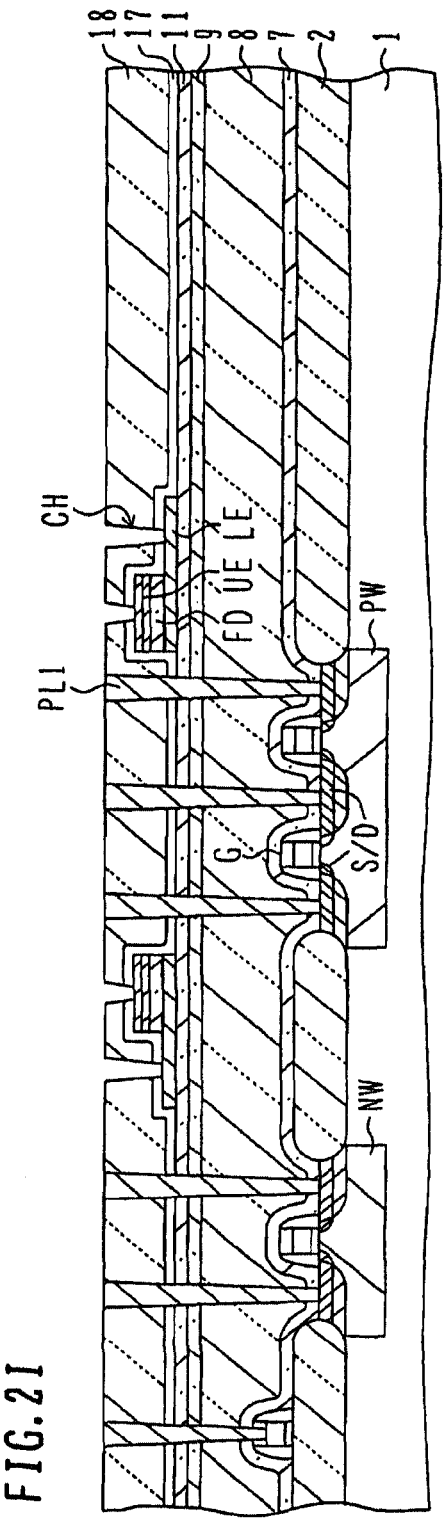

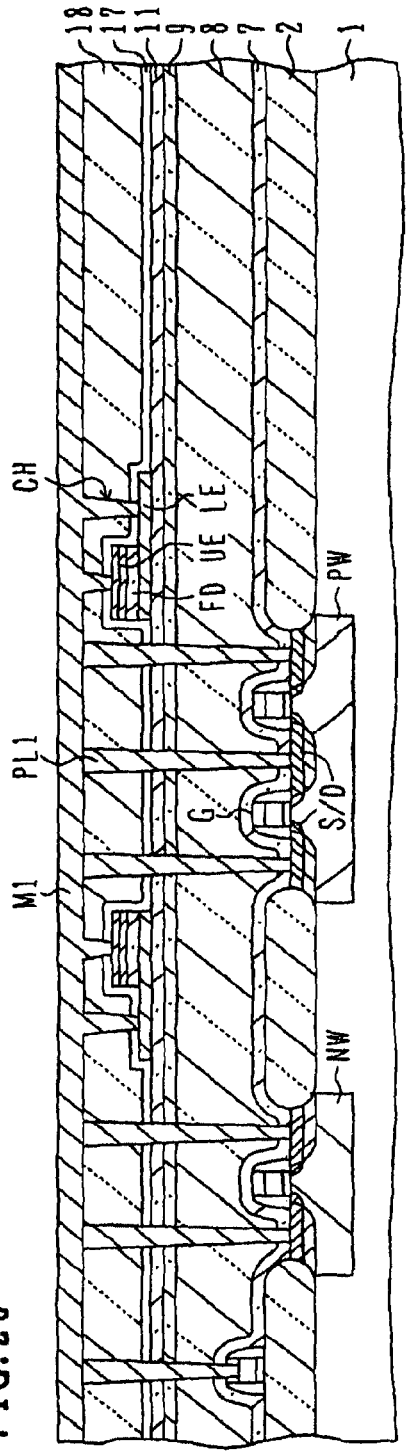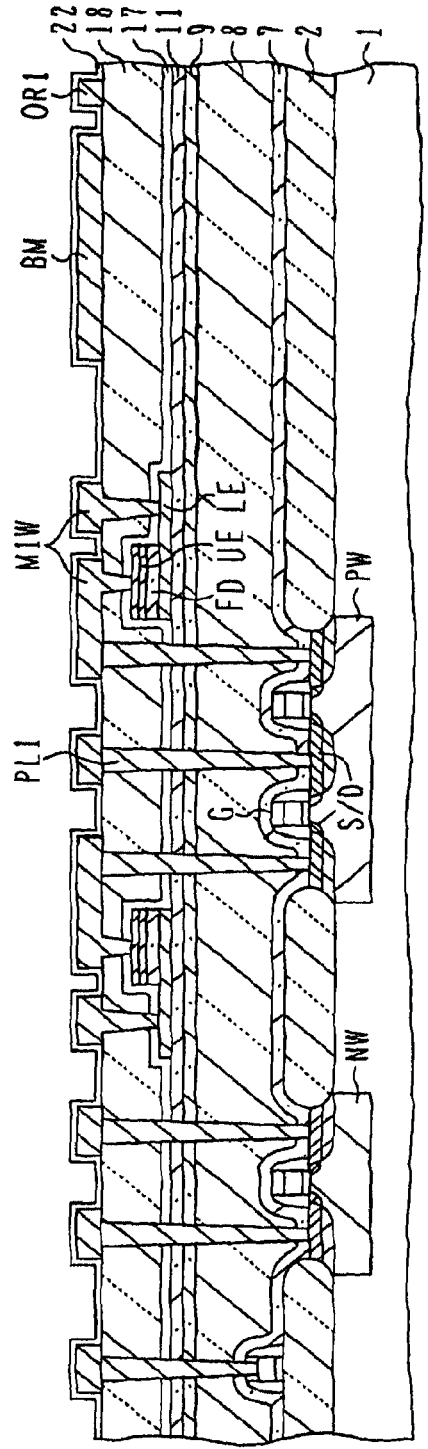
FIG. 2J
FIG. 2K

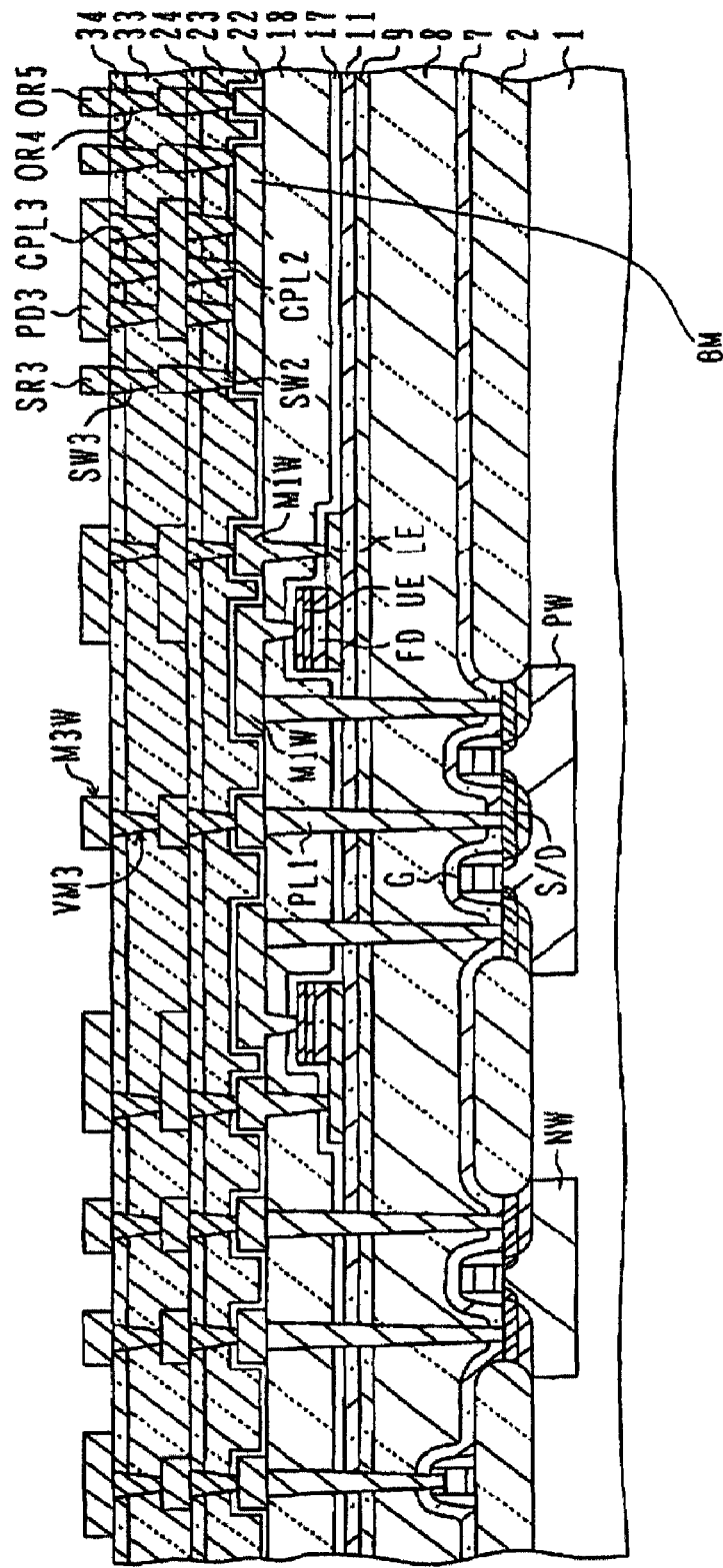

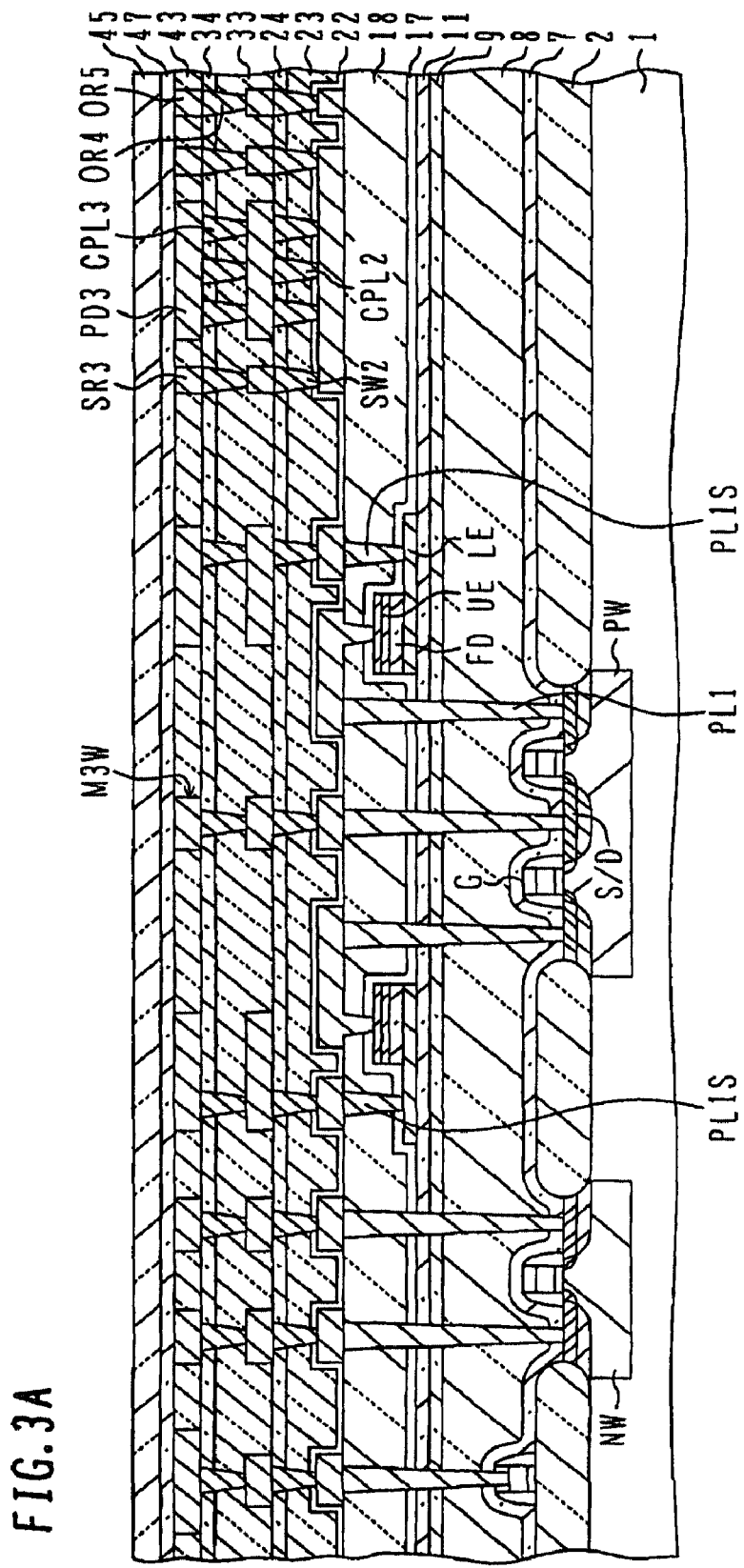

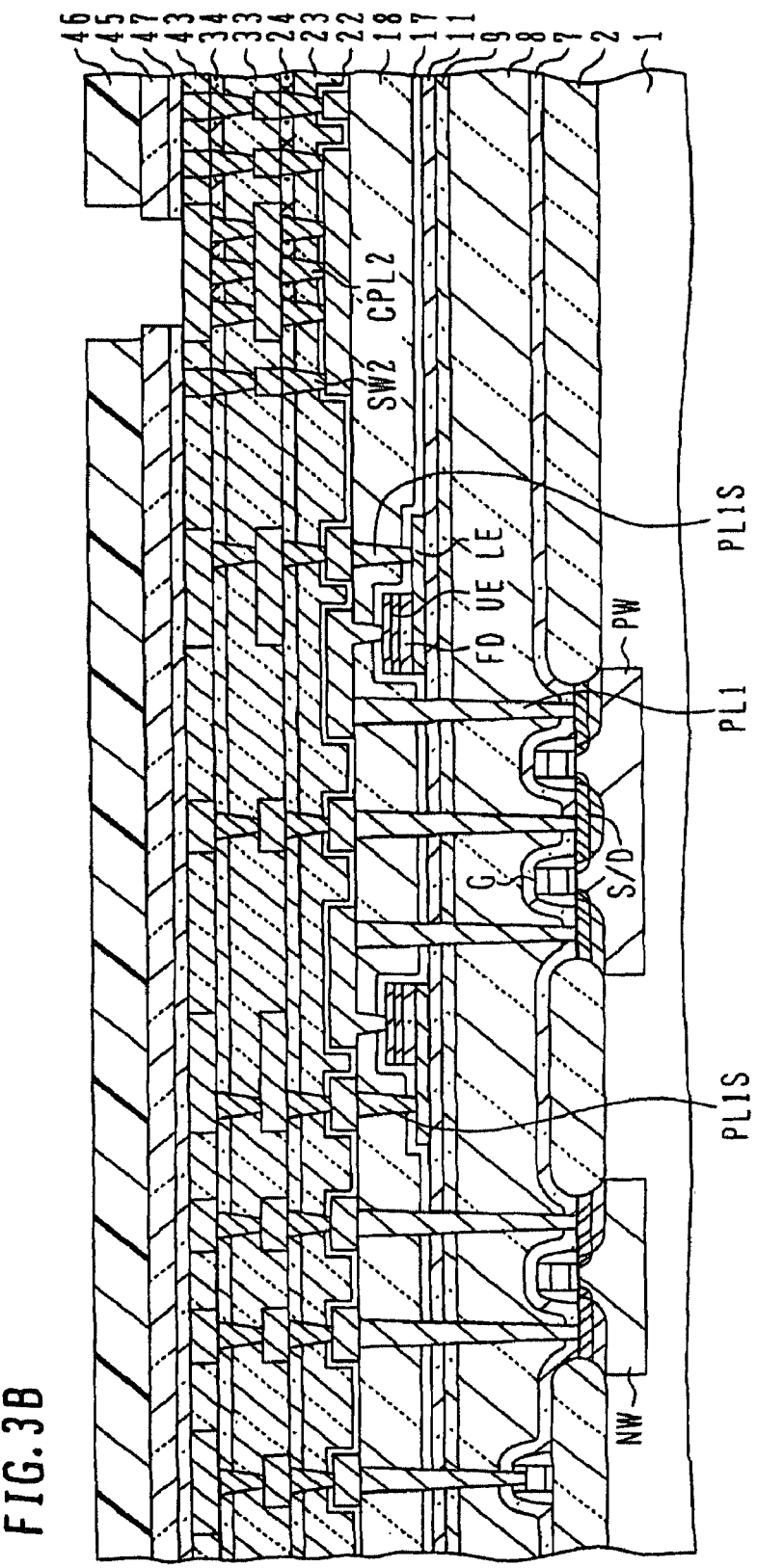

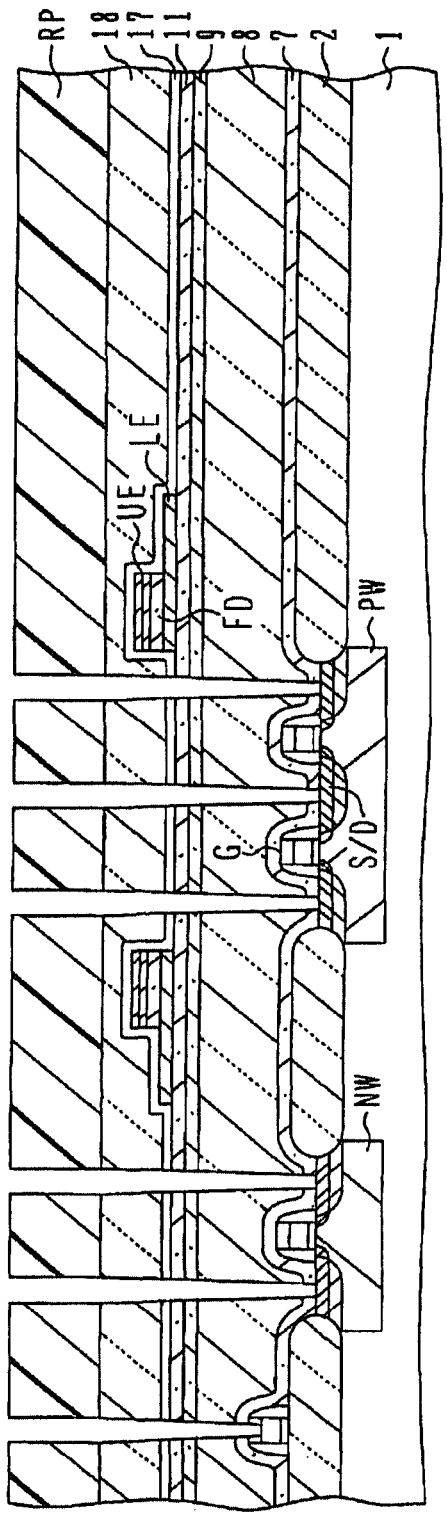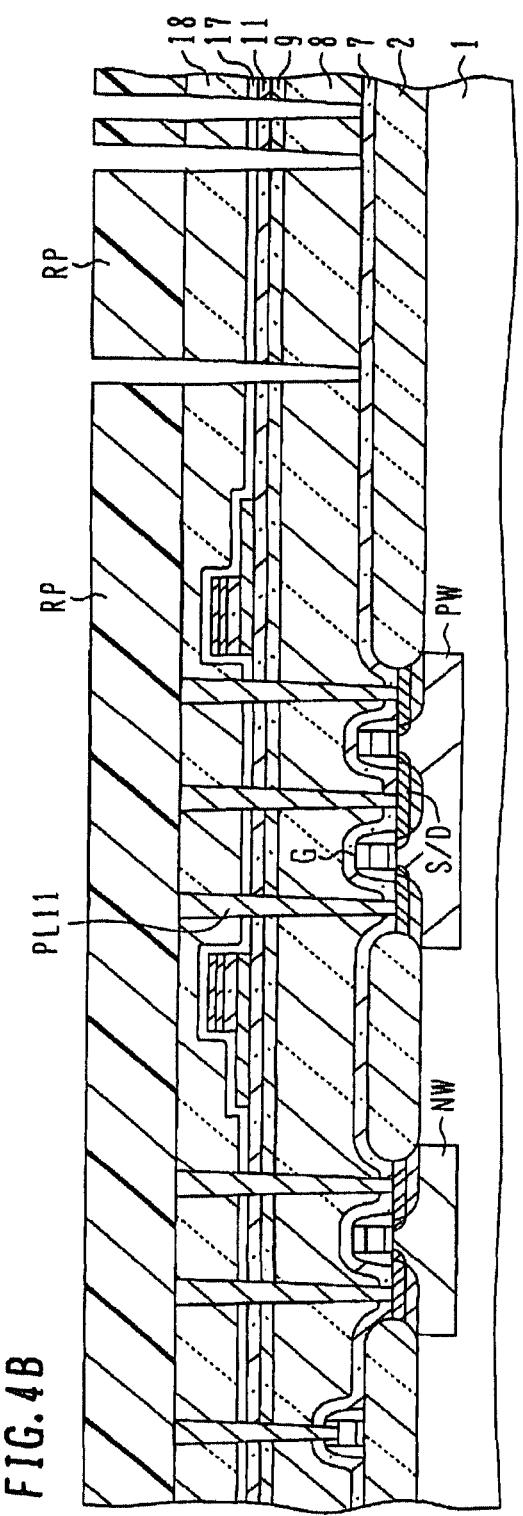

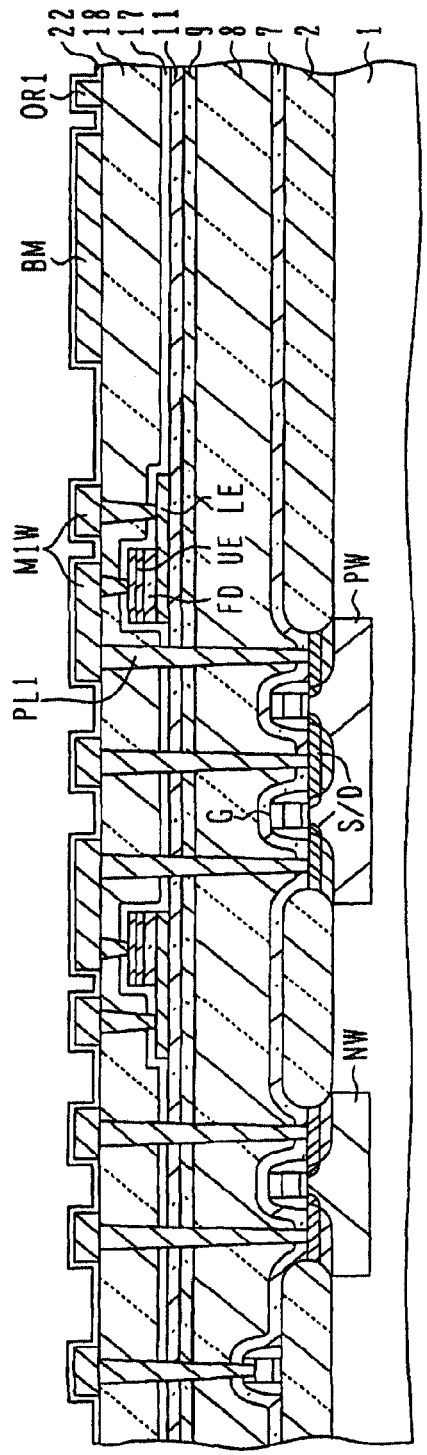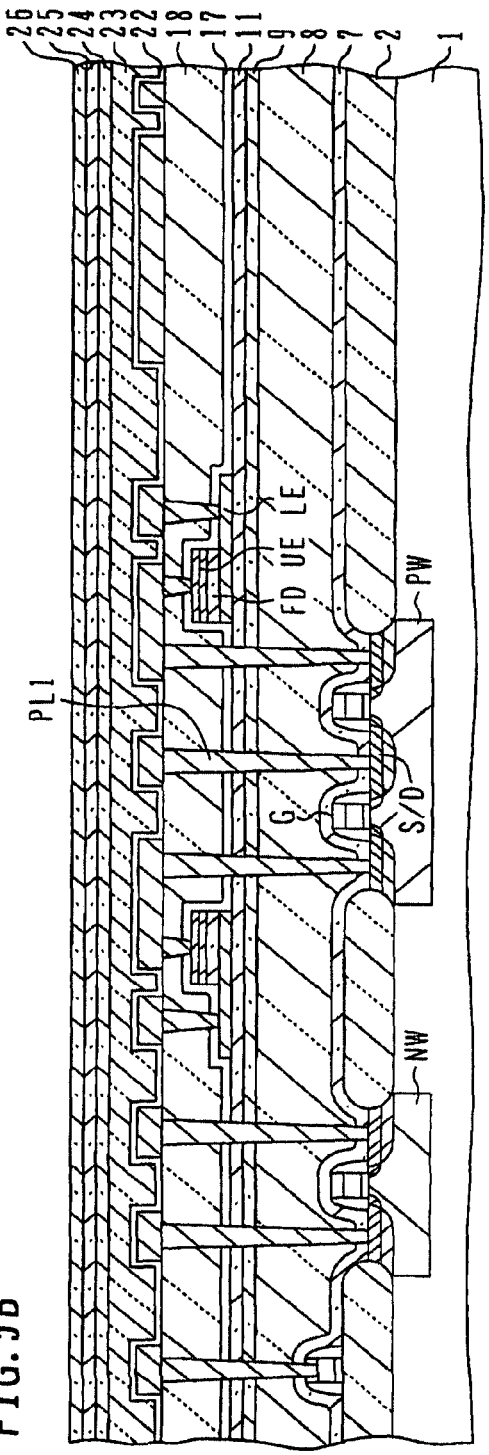
FIG.5A
FIG.5B

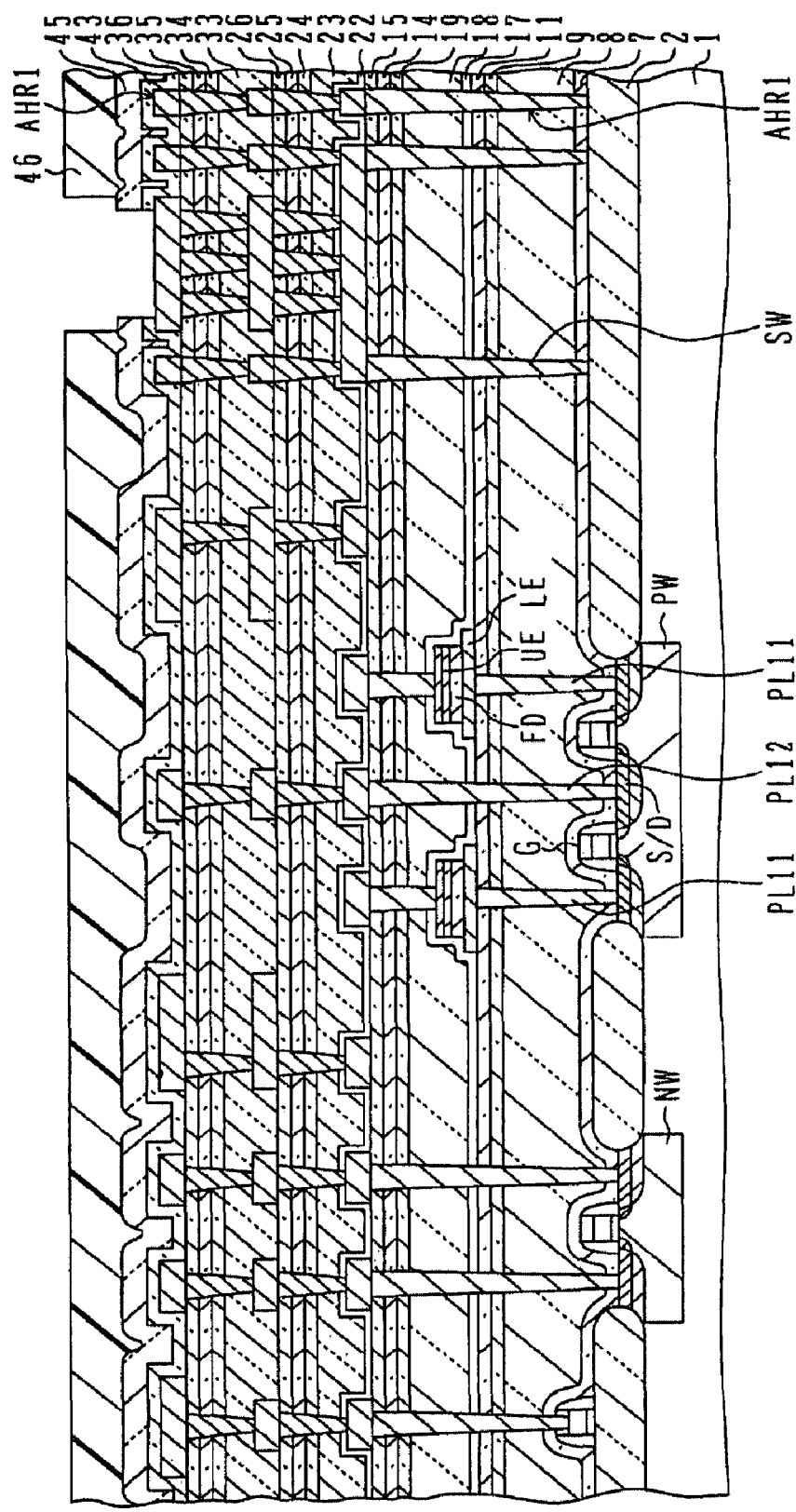

SEMICONDUCTOR DEVICE WITH IMPROVED PADS

CROSS REFERENCE TO RELATED APPLICATION

This application is a continuation application of international application, PCT/JP2005/023965, the entire contents of which are incorporated herein by reference.

BACKGROUND

A) Field

The embodiments discussed herein are directed to a semiconductor device, which may relate to a semiconductor device having pads for connection to an external circuit and for inspection.

B) Description of the Related Art

It is well known that as moisture or water contents permeate a circuit region of a semiconductor integrated circuit device, the performance of the device is degraded. In order to shield moisture permeating from a chip outer periphery, a moisture resistant ring for shielding moisture is formed along the chip outer periphery.

JP-A-2002-270608 (applicant: Fujitsu Limited) proposes a semiconductor device having a damascene wiring structure burying wiring patterns and via conductors in an interlevel insulating film, in which a moisture resistant ring disposed along an outer periphery of a chip is formed by a lamination of a via ring formed in the same level (layer) as the via conductors and a wiring ring formed in the same level (layer) as the wiring patterns.

JP-A-2004-297022 (Applicant: NEC Electronics Corporation) proposes to dispose a plurality of moisture resistant (sealing) rings along a chip outer periphery and connect the bottoms of the rings to a diffusion region of the semiconductor substrate.

JP-A-2004-297022 (Applicant: NEC Electronics Corporation) proposes to dispose a plurality of moisture resistance (sealing) rings along a chip outer periphery and connect the bottoms of the rings to a diffusion region in the semiconductor substrate.

A semiconductor integrated circuit device has pads in the same level (layer) as or above the uppermost wiring layer, on which pads probe needles are abutted for inspection or wires are bonded for connection to an external circuit. Pads have a relatively large size as compared with wiring patterns. The upper surface of each pad is exposed to allow a probe needle to be abutted thereon or a connection wire to be bonded thereto. Until a semiconductor integrated circuit device is completed, a plurality of inspections is performed, and a chip finally judged as a good chip is packaged.

When a probe needle is abutted on a pad during inspection, a crack may be formed in the pad. Even if a crack is formed, a wire can be bonded to the pad, and this chip can be used as a final product. However, the pad surface remains in an exposed state even after wire bonding so that moisture and hydrogen are likely to be permeated through the crack. As the permeated moisture and hydrogen reach wirings or oxide, chemical reaction occurs and the performance of a semiconductor device is adversely affected.

JP-A-2004-134450 (applicant: Fujitsu Limited) proposes to form a pad by an alternate lamination of a flat pad layer and a loop-shaped (tubular) via wall. Even if a crack is formed in the flat pad layer at the uppermost layer, moisture permeated into the lower portion is prevented from being diffused by a cup-shaped sealing structure constituted of the loop-shaped via wall and flat pad layer and from permeating into a circuit region.

JP-A-2005-175204 (applicant: Fujitsu Limited) proposes to dispose a first moisture resistant ring inside a pad train and a second moisture resistant ring outside the pad train. If a conductive moisture resistant ring is used, the first moisture resistant ring is cut off around a wiring portion connecting the pad.

Ferroelectric random access memories (FeRAM) are under development in recent years which use ferroelectric capacitors and store information by utilizing polarization reversal of ferroelectric material. A ferroelectric memory is a nonvolatile memory whose stored information will not be erased even if a power supply is turned off, and is expected to realize high integration, high speed driving, high durability and low power consumption.

The ferroelectric memory stores information by utilizing hysteresis characteristics of ferroelectric material. A ferroelectric capacitor sandwiching a ferroelectric film as a capacitor dielectric film between a pair of electrodes generates polarization corresponding to a voltage applied across the electrodes, and maintains the polarization even if the applied voltage is disconnected. As a polarity of an applied voltage is reversed, polarity of the polarization is also reversed. By detecting the polarization, information can be read. Mainly used as the material of ferroelectric film is ferroelectric oxide material having perovskite crystal structure and a large coercive polarization amount, e.g., 10 $\mu C/cm^2$ to 30 $\mu C/cm^2$, such as PZT (Pb(Zr$_{1-x}$Ti$_x$)O$_3$) and SBT (SrBi$_2$Ta$_2$O$_9$). In order to form an ferroelectric oxide film having excellent characteristics, the film is required to be formed or to be subjected to heat treatment in an oxidizing atmosphere. Lower electrodes (also upper electrodes if necessary) are often made of noble metal hard to be oxidized, noble metal or noble metal oxide maintaining conductivity even when being oxidized.

Transistors and a lower interlevel insulating film are formed on a silicon substrate prior to forming ferroelectric capacitors. After forming conductive plugs of W or the like extending through the lower interlevel insulating film and contacting transistors, ferroelectric capacitors are formed each having a lower electrode, a ferroelectric film and an upper electrode. It is necessary to prevent the oxidizing atmosphere during forming the ferroelectric film from adversely affecting the lower structure. Multilevel wirings are thereafter formed in upper interlevel insulating film.

An interlevel insulating film of a semiconductor integrated circuit device is often made of silicon oxide. Silicon oxide has high affinity with moisture. As moisture permeates from external, the moisture can pass through an interlevel insulating film and reach wirings, capacitors, transistors and the like. As the moisture reaches a capacitor, particularly a ferroelectric capacitor, characteristics of a dielectric film, particularly of a ferroelectric oxide film are degraded. If the ferroelectric film is reduced by hydrogen derived from the permeated moisture and oxygen defects are formed, crystallinity is degraded. Characteristics such as a coercive polarization amount and a dielectric constant are degraded. Similar phenomena occur due to long term usage. As hydrogen permeates, the characteristics are degraded more directly than moisture. Permeation of moisture and hydrogen is prevented by forming a cover film having moisture resistance on multilevel wirings and forming a moisture resistant ring along a semiconductor chip outer periphery. However, a bonding pad for inspection or external connection is required to be in exposed state.

In a semiconductor integrated circuit device having a moisture resistance ring, the area influenced most by moisture and hydrogen permeated from external is considered to be pad and its nearby area. For example, an interlevel insulating film such as a silicon oxide film, a silicon nitride film and a polyimide film are formed covering the uppermost wiring layer including pads. In order to allow electric contacts to the pads, the polyimide film, silicon nitride film and silicon oxide film on the pads are removed. Moisture and hydrogen from external can directly contact the pads.

JP-A-2003-174146 (applicant: Fujitsu Limited) proposes to form an upper electrode by a lamination of two types of noble metal oxide films. In order to avoid adverse effects of an oxidizing atmosphere during forming a ferroelectric film, transistors formed on a semiconductor substrate are covered with an insulating barrier film having an oxygen shielding function such as a silicon nitride film and a silicon oxynitride film. In order to prevent the characteristics of a ferroelectric capacitor during heat treatment in a reducing atmosphere, the ferroelectric capacitor is covered with an insulating barrier film having a hydrogen shielding function such as an alumina film.

SUMMARY

It is an aspect of the embodiments discussed herein to provide a semiconductor device including:

a semiconductor substrate;

a circuit portion formed on the semiconductor substrate and including a plurality of semiconductor elements;

insulating lamination formed above the semiconductor substrate and covering the circuit portion;

multilevel wiring structure formed in the insulating lamination and including wiring patterns and via conductors; and pad electrode structure formed above the semiconductor substrate and connected to the multilevel wiring structure, the pad electrode structure including pad wiring patterns in a plurality of levels and pad via conductors interconnecting the pad wiring patterns, at least the pad wiring pattern in an uppermost level including a pad pattern and a sealing pattern surrounding the pad pattern in a loop shape with some distance from the pad pattern, at least one of the pad wiring patterns in a level other than the uppermost level having a continuous extended pad pattern of a size overlapping the sealing pattern, the pad via conductors including a plurality of columnar via conductors disposed in an area overlapping the pad pattern and a loop-shaped wall portion disposed in an area overlapping the sealing pattern, the pad pattern of the pad wiring pattern or the extended pad pattern and the columnar via conductors constituting a laminated bonding pad, and the extended pad pattern, the sealing pattern and the loop-shaped wall portion surrounding the laminated bonding pad to form a cup-shaped moisture resistant structure having a function of shielding moisture and hydrogen.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 3A and 3B are cross sectional views showing modifications of the first embodiment.

FIGS. 4A to 4E are cross sectional views and a plan view of a semiconductor substrate illustrating main processes of a semiconductor device manufacture method according to a second embodiment.

FIGS. 5A to 5D are cross sectional views of a semiconductor substrate illustrating main processes of a semiconductor device manufacture method according to a third embodiment.

FIG. 7 is a cross sectional view showing a modification.

DESCRIPTION OF THE PREFERRED EMBODIMENTS

Figure 1A:
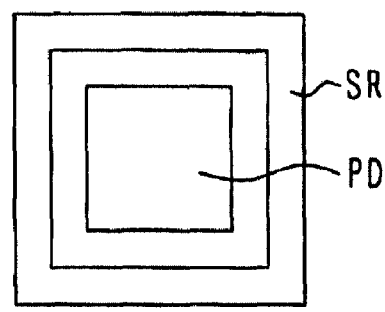
FIGS. 1A to 1D are plan views and a cross sectional view showing structure of a fundamental embodiment.
Figure 1B:
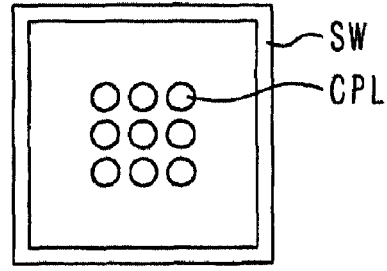
Figure 1C:
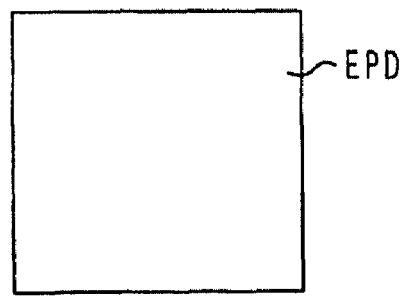
Figure 1D:
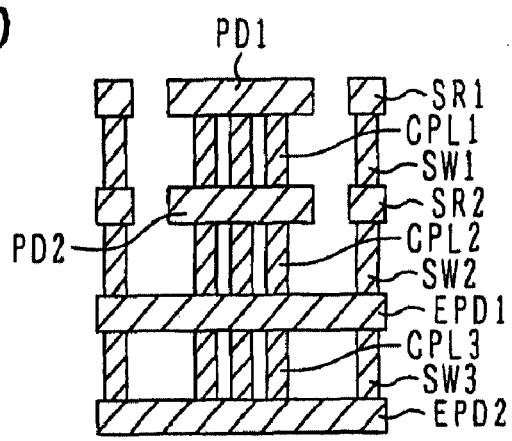

FIGS. 1A to 1D schematically show structure of a fundamental embodiment, wherein FIGS. 1A to 1C are plan views and FIG. 1D is a cross sectional view. A pad electrode structure is formed by lamination of wiring layers and via conductor layers.

FIG. 1A shows wiring patterns to be used for an uppermost wiring layer and other wiring layers. The wiring patterns include a pad pattern PD and a loop-shaped sealing pattern (pad sealing pattern) SR surrounding the periphery of the pad pattern PD and spaced by some distance from the pad pattern.

FIG. 1B shows the structure of a via conductor layer, The via conductor layer of the pad electrode structure includes columnar connection plugs CPL formed in an area corresponding to (within or overlapping) the pad pattern PD and a sealing wall SW of a loop-shaped wall formed in an area corresponding to (within or overlapping the inner periphery of) the sealing pattern SR.

FIG. 1C shows an extended pad pattern EPD to be used for at least one wiring layer other than the uppermost layer. The extended pad pattern EPD has a continuous region which is a wiring pattern continuous with the region corresponding to (including) the pad pattern PD and extending to the region corresponding to (including or overlapping the inner periphery of) the sealing pattern SR.

The structure shown in either of FIG. 1A and FIG. 1C is used as the wiring pattern, and the via conductor layer shown in FIG. 1B is used as the via conductor layer between wiring patterns.

FIG. 1D shows an example of a combination of wiring patterns and via conductor layers. A wiring pattern disposed in the uppermost layer is the wiring pattern shown in FIG. 1A having a pad pattern PD1 in a central area and a sealing pattern SR1 surrounding the pad pattern. Under the wiring pattern, a via conductor layer is formed including connection plugs CPL1 and a sealing wall SW1. Disposed under the via conductor layer are a pad pattern PD2 having the same shape as that of the uppermost wiring pattern layer and a sealing pattern SR2. Disposed under these patterns are connection plugs CPL2 and sealing wall SW2 providing the same structure as that of the via conductor layer under the uppermost layer. Under these connection plugs and sealing wall, an extended pad pattern EPD1 is disposed. In this structure described above, the extended pattern EPD1 and the overlying sealing walls SW2 and SW1 and sealing patterns SR2 and SR1 constitute a cup-shaped moisture resistant structure. Under the extended pad pattern EPD1, another extended pad pattern EPD2 is disposed via a via conductor layer including connection plugs CPL3 and a sealing wall SW3. In this structure, the extended pad pattern EPD2 and the sealing wall SW3 of the via conductor layer constitute a cup-shaped moisture resistant ring structure coupled to the bottom of the extended pad pattern EPD1. The extended pad pattern EPD may be used at any layer other than the uppermost layer, and at least one extended pad pattern is used in each lamination structure. The lowermost layer is preferably formed by an extended pad pattern EPD. With this structure, even if a crack is formed in the pad pattern PD1 by stress applied to the pad pattern PD1 at the uppermost wiring layer, moisture and hydrogen permeating the crack can be prevented from diffusing a nearby region. Since the sealing pattern SR is separated from the pad pattern PD, the sealing pattern SR is hardly damaged even if a crack is formed in the pad pattern PD by applied stress or the like.

More specific embodiments will be described below.

Figure 2L:
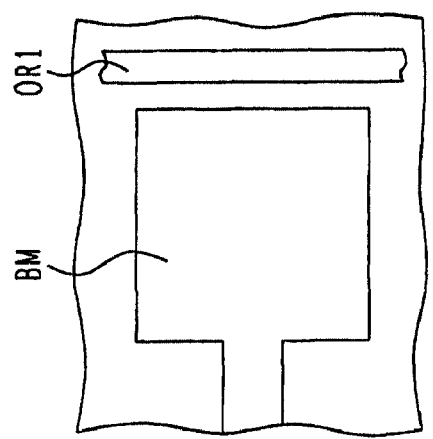
FIGS. 2A to 2S are cross sectional views and plan views of a semiconductor substrate illustrating main processes of a semiconductor device manufacture method according to a first embodiment.
Figure 2M:
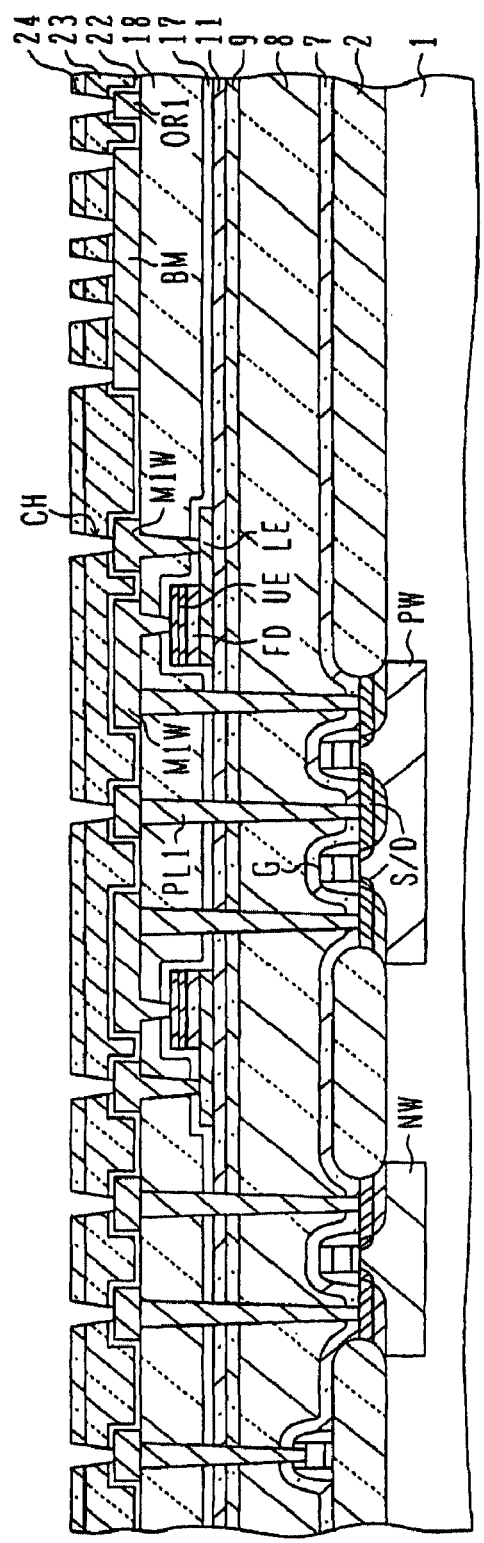
Figure 2N:
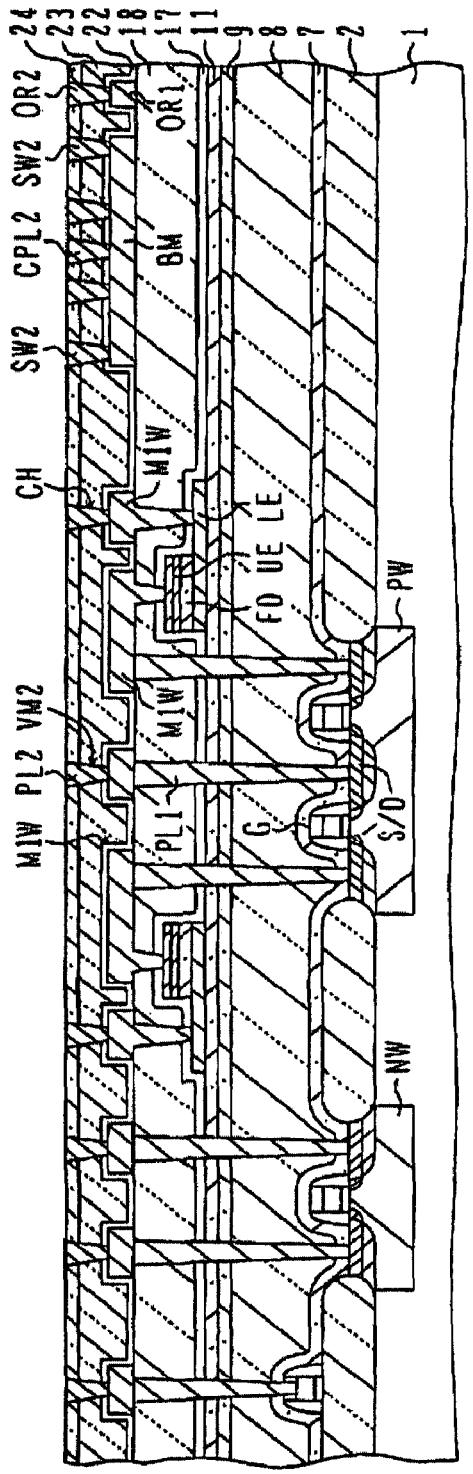
Figure 2O:
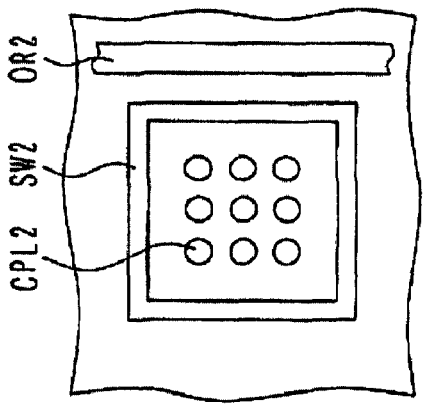
Figure 2P:
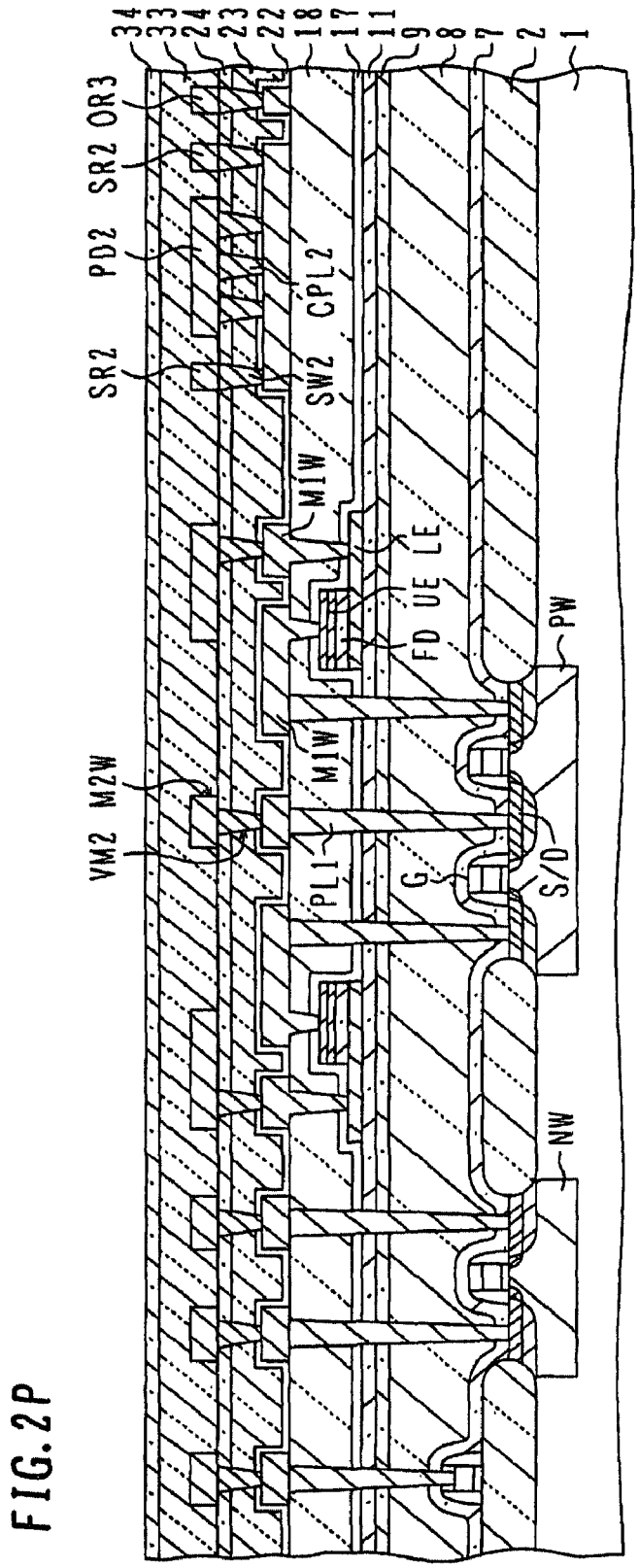
Figure 2R:
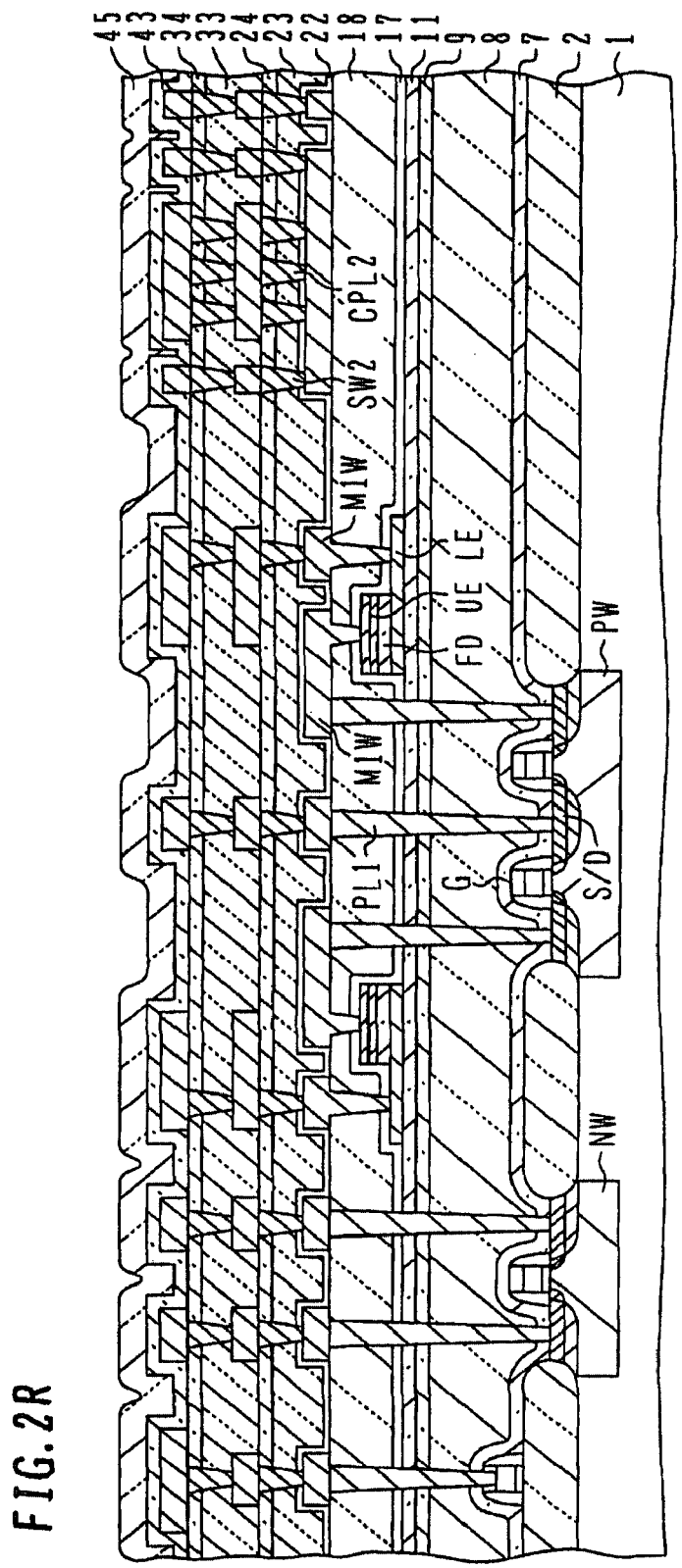
Figure 2S:
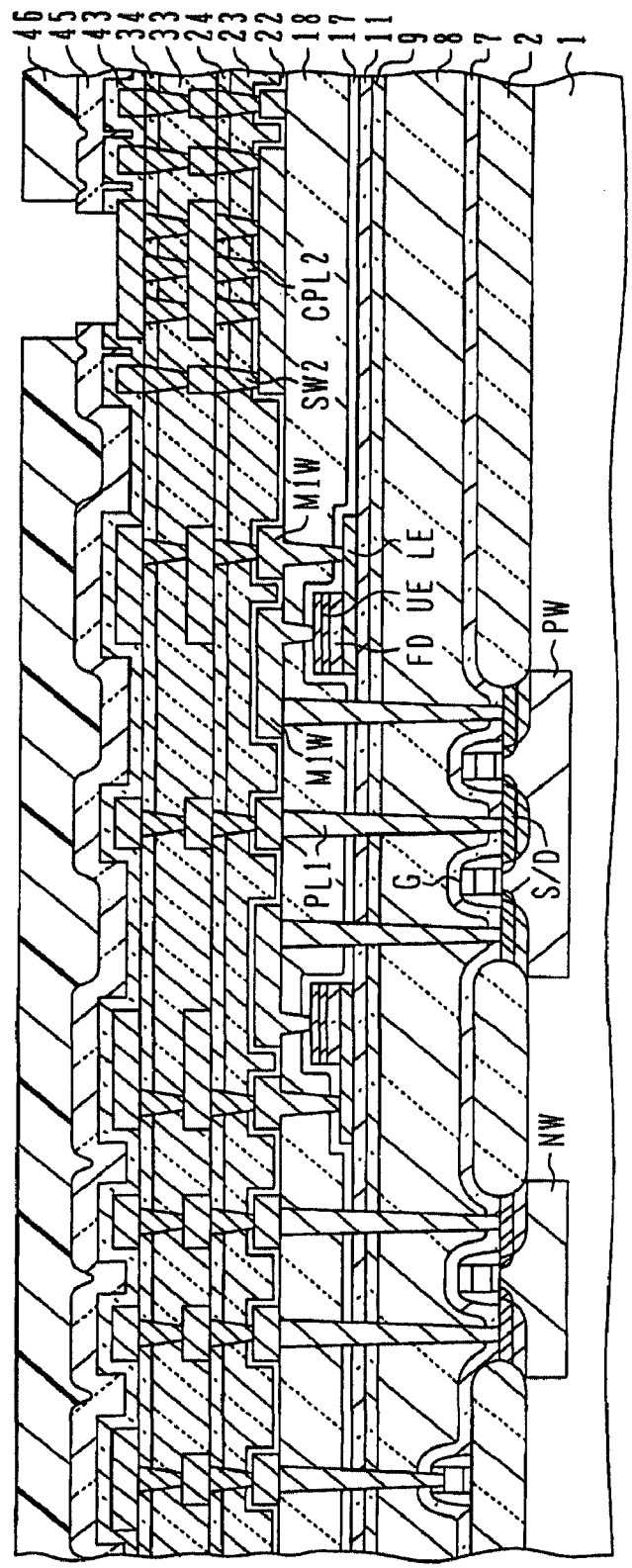

FIGS. 2A to 2S are cross sectional views and supplemental plan views of a semiconductor substrate illustrating main processes of a semiconductor device manufacture method according to the first embodiment.

As shown in FIG. 2A, an isolation region 2 surrounding active regions necessary for circuit structures is formed in a semiconductor substrate 1, e.g., a silicon substrate, and an n-type well NW and a p-type well PW are formed in the active regions. In the structure shown, although the isolation region 2 is formed by local oxidation of silicon (LOCOS), it may be formed by shallow trench isolation (STI). A gate electrode G is formed above the active region, and source/drain regions S/D are formed in the active region on both sides of the gate electrode.

FIG. 2B is an enlarged cross sectional view of a transistor portion. A gate insulating film 3 of silicon oxide or the like is formed on the surface of the active region, and a gate electrode 4 made of a lamination of a polysilicon layer 4a and a silicide layer 4b is formed on the gate insulating film and covered with a protective insulating film 5 of silicon oxide or the like. On side walls of this insulated gate structure, side wall spacers 6 are formed. In the active regions on both sides of the gate electrode 4, extension regions EX for forming shallow junctions are formed, and in the active regions on both sides of a pair of side wall spacers 6, high concentration source/drain regions HD are formed to constitute the source/drain regions S/D along with the extension regions EX.

As shown in FIG. 2C, a silicon oxynitride film 7 in a range of 50 to 250 nm thick, e.g., about 200 nm thick is formed on the semiconductor substrate by plasma CVD, covering the semiconductor devices such as MOS transistors. This silicon oxynitride film 7 has a barrier function against moisture and hydrogen to prevent the characteristics of MOS transistors from being degraded. A non-doped silicate glass (NSG, silicon oxide) film 8 is formed on the silicon oxynitride film 7 to a thickness of about 600 nm by plasma CVD using TEOS as a source, and polished by a thickness of about 200 nm by chemical mechanical polishing (CMP) to planarize the surface thereof. On the planarized surface, a silicon oxide film 9 is formed to a thickness of about 100 nm by plasma CVD using TEOS also as a source. Thereafter, a dehydrating process is executed, for example, for about 30 minutes at 650° C. in a nitrogen atmosphere. Thereafter, on the silicon oxide film 9, an alumina film 11 is formed to a thickness of, e.g., about 20 nm by physical vapor deposition (PVD) such as sputtering. The alumina film 11 has a robust function of shielding moisture and hydrogen. After the alumina film 11 is formed, heat treatment is executed by rapid thermal annealing (RTA), for example, about 60 seconds at 650° C. in an oxygen atmosphere. This heat treatment improves the quality of the alumina film 11. On the alumina film 11, a lamination of a lower electrode film LE, a ferroelectric film FD and an upper electrode film UE is formed. For example, the lower electrode LE is made of a Pt film of 155 nm thick formed by PVD, and the ferroelectric film FD is made of a PZT film of 150 to 200 nm thick formed by PVD. After the ferroelectric film FD is formed, an annealing process is executed, for example, by RTA for 90 seconds at 585° C. in an $O_2$ atmosphere (flow rate: 0.025 lt/min), to improve the quality of the PZT film. A first upper electrode film UE1 on the ferroelectric film FD is made of an $IrO_2$ film of 50 nm thick formed by PVD. After the first upper electrode film UE1 is formed, an annealing process is executed, for example, by RTA for 20 seconds at 725° C. in an $O_2$ atmosphere (flow rate: 0.025 lt/min), to crystallize the first upper electrode film. Thereafter, as a second upper electrode film UE2, an $IrO_2$ film of about 200 nm thick is formed by PVD. After the lamination structure for forming a ferroelectric capacitor structure is formed in this manner, a photoresist pattern PR is formed on this lamination structure. By using the photoresist pattern PR as an etching mask, the upper electrode film UE is etched. After etching, the photoresist pattern PR is removed, and for recovery annealing for the PZT film, heat treatment is executed, for example, in a vertical furnace for 60 minutes at 650° C. in an $O_2$ atmosphere (flow rate: 20 lt/min). By forming a photoresist pattern, the PZT film FD is etched. After etching, for recovery annealing for the PZT film, heat treatment is executed, for example, in a vertical furnace for 60 minutes at 350° C. in an $O_2$ atmosphere (flow rate: 20 lt/min).

As shown in FIG. 2D, an alumina film 16 having a thickness of, e.g., 50 nm is formed on the whole surface of the semiconductor substrate by PVD, covering the patterned upper electrode and ferroelectric film. After the alumina film is formed, heat treatment is executed, for example, in a vertical furnace for 60 minutes at 550° C. in an $O_2$ atmosphere (flow rate: 20 lt/min), to improve the quality of the alumina film. A photoresist pattern PR for patterning the lower electrode is formed on the alumina film 16. By using the photoresist pattern PR as an etching mask, the lower electrode film LE is etched. After etching the lower electrode film LE, the recovery annealing for the PZT film is executed in the manner similar to that described above, for example, under the conditions of for 60 minutes at 650° C. in an $O_2$ atmosphere (flow rate: 20 lt/min). Since the alumina film 16 and lower electrode film LE are etched in the same pattern, the alumina film 16 other than the lower electrode LE is removed.

As shown in FIG. 2E, an alumina film 17 of about 50 nm thick is further formed, for example, by PVD, covering the patterned ferroelectric capacitor. The alumina film 17 shown includes the already formed alumina film 16. After the alumina film 17 is formed, heat treatment is executed in the manner similar to that described above, for 60 minutes at 550° C. in an $O_2$ atmosphere (flow rate: 20 lt/min), to improve the quality of the alumina film. Thereafter, a silicon oxide film 18 is formed on the whole surface of the semiconductor substrate to a thickness of 1500 nm by plasma CVD using TEOS as a source, covering the aluminum film 17. Thereafter, the surface thereof is planarized by CMP. Annealing is executed in $N_2O$ plasma, for example, for 2 minutes at 350° C., to nitridize the surface of the silicon oxide film 18.

As shown in FIG. 2F, by forming a resist pattern RP having a pattern of contact holes CH for forming bulk contacts, the silicon oxide film 18, alumina films 17 and 11, silicon oxide films 9 and 8 and silicon nitride film or silicon oxynitride film 7 are etched to expose the surface of the active region (source/drain regions). In a contact area of the gate electrode pattern on the isolation region, the silicon oxide film 5 under the silicon oxynitride film or silicon nitride film 7 is etched to expose the conductive surface of the gate electrode 4.

As shown in FIG. 2G, after the contact holes CH are formed, the resist pattern RP is removed. For example, a Ti film of 20 nm thick and a TiN film of 50 nm thick are deposited by PVD, and a W film of 500 nm thick is deposited, for example, by CVD, to bury the contact holes. In order to remove the conductive film other than that in the contact holes, CMP is performed to polish and remove the W film and the like deposited on the surface of the silicon oxide film 18. In order to nitridize the surface of the exposed silicon oxide film 18, plasma annealing is executed, for example, by $N_2O$ plasma for 2 minutes at 350° C. Next, a silicon oxynitride film 21 is deposited to a thickness of about 100 nm by plasma CVD. The plasma annealing may be executed by plasma CVD in a plasma CVD system for forming the SiON film 21. The silicon oxynitride film 21 is a protective film for protecting the surfaces of the W plugs from oxidation.

As shown in FIG. 2H, by using a resist pattern as an etching mask, contact holes CH are formed for the upper electrode UE and lower electrode LE of the ferroelectric capacitor. After the contact holes are etched, heat treatment is executed, for example, in a vertical furnace for 60 minutes at 500° C. in an $O_2$ atmosphere (flow rate: 20 lt/min), to recover damage to the PZT film. The silicon oxynitride film 21 protects the W plugs PL1 so as not to be oxidized during the heat treatment in the oxidizing atmosphere.

As shown in FIG. 2I, the silicon oxynitride film 21 finished its role is removed, for example, by etch-back.

As shown in FIG. 2J, for example, a TiN film of 150 nm thick, an Al—Cu alloy film of 550 nm thick, a Ti film of 5 nm thick and a TiN film of 150 nm are laminated by PVD to form a first metal wiring film M1 burying the contact holes CH. The processes described up to this are conventionally well known processes, and other well known processes may also be used.

As shown in FIG. 2K, by forming a resist pattern on the lamination film M1, the first metal wiring layer M1 is etched to form first metal wirings M1W. This process forms not only the first metal wirings M1W in the circuit area but also a base metal pattern BM in an area where a pad structure is formed, and an outer moisture resistant ring OR1 in an area along a chip outer periphery. The base metal pattern BM constitutes the extended pad pattern described earlier.

After the first metal wiring layer is patterned, heat treatment is executed in a vertical furnace, for example, for 30 minutes at 350° C. in an $N_2$ atmosphere (flow rate: 20 lt/min). An alumina film 22 having a thickness of, e.g., 20 nm is formed on the silicon oxide film 18 by PVD, covering the first metal wiring pattern. Permeation of moisture and hydrogen from an external into the ferroelectric film FD is suppressed by covering the lower surface of the ferroelectric capacitor with the alumina film 11, covering the upper surface and side wall surfaces with the alumina film 17 and disposing the alumina film 22 above the ferroelectric capacitor.

FIG. 2L shows an example of the shape of the base metal BM in the bonding pad area. The base metal BM forms an extended pad pattern shape continuous with the bonding pad area, and has a wiring portion led toward the circuit area. Since the outer moisture resistant ring OR1 is formed along the chip outer periphery, it is disposed in a shape passing outside a plurality of pads.

As shown in FIG. 2M, on the alumina film 22, a silicon oxide film 23 is formed to a thickness of about 2600 nm by CVD using, for example, TEOS as a source, and the surface thereof is planarized and nitridized by plasma annealing similar to that described earlier. Another silicon oxide film 24 is formed to a thickness of about 100 nm by CVD using TEOS as a source. Plasma annealing is executed further to nitridize the surface of the silicon oxide film 24. After a first interlevel insulating film is formed in this manner, a resist pattern is formed to etch contact holes for connecting the first metal wirings M1W and second metal wirings.

As shown in FIG. 2N, for example, a TiN film of about 50 nm thick is deposited by PVD, and then a W film of about 650 nm is deposited by CVD, to form a via conductor layer VM2 burying the contact holes. Etch-back or CMP is performed to remove the W film and the like deposited on the interlevel insulating film 24.

FIG. 2O is a schematic plan view showing the structure of a via conductor layer burying the contact holes in the bonding pad area. There are formed connection plugs CPL2 for connecting upper and lower pad patterns and a sealing wall SW2 of a loop shape surrounding the connection plugs CPL2. The sealing wall SW2 is formed along the outer periphery of the base metal BM shown in FIG. 2L, and constitutes a cup shape together with the base metal BM.

As shown in FIG. 2P, second metal wirings M2W are formed on the via conductor layer VM2. In the pad structure area, there are formed a pad region PD2 connected to the connection plugs CPL2 and a sealing pattern SR2 surrounding the pad region and connected to the sealing wall SW2. In the chip moisture resistant ring area, a moisture resistant ring layer OR3 is formed. A TEOS silicon oxide film 33 is deposited to a thickness of, e.g., 2200 mm, covering the second metal wiring patterns M2W, CMP is performed for planarization, and thereafter the surface thereof is nitridized by plasma annealing. Further, a TEOS silicon oxide film 34 is deposited to a thickness of, e.g., about 100 nm, and plasma annealing is performed for nitridation. The second interlevel insulating film is formed in this manner.

As shown in FIG. 2Q, by the process similar to that described above, a via conductor layer VM3 is buried in the second interlevel insulating films 33 and 34. In the pad structure area, a structure is formed having connection plugs CPL3 and a sealing wall SW3 similar to those shown in FIGS. 2N and 2O. Third metal wiring patterns M3W are formed connecting the via conductor layer VM3. In the pad structure area, a structure is formed having a pad pattern PD3 and a sealing pattern SR3 similar to those shown in FIG. 2P. In the structure shown, a pad structure laminating the connection plugs CPL and pad patterns PD is formed above the central area of the base metal BM. A loop-shaped wall portion is formed laminating the sealing walls SW and sealing patterns SR above the outer periphery of base metal BM, to thereby constitute a structure that the cup-shaped moisture resistance pattern surrounds the laminated pad structure.

As shown in FIG. 2R, a TEOS silicon oxide film 43 is deposited by CVD to a thickness of, e.g., about 100 nm, covering the multilevel wirings, the surface thereof is nitridized by plasma annealing, and thereafter, a silicon nitride film 45 is deposited by plasma CVD to a thickness of, e.g., 350 nm.

As shown in FIG. 2S, by using a resist pattern, the silicon nitride film 45 and silicon oxide film 43 are etched. The upper TiN layer and Ti film of the third wiring layer are etched at the same time. The bonding pad having an aluminum surface is therefore exposed. A photosensitive polyimide layer 46 is coated on the silicon nitride film 45, exposed and then developed to remove the polyimide layer in the bonding pad area. After the polyimide pattern is formed, polyimide is cured, for example, in a horizontal furnace for 40 minutes at 310° C. in an N₂ atmosphere (flow rate 100 lt/min). A semiconductor device with pads is formed in this manner. Since the laminated bonding pad is surrounded by the base metal BM and the sealing walls and sealing patterns laminated above the periphery of the base metal, even if a crack is formed in the uppermost pad pattern during inspection or the like, permeated moisture can be suppressed from invading into the circuit area.

According to the first embodiment, the surface of the silicon oxide film 43 is exposed in the opening of the bonding pad as shown in FIG. 2S. Moisture, hydrogen or the like may invade from the exposed surface.

FIGS. 3A and 3B illustrate a semiconductor device manufacture method according to the second embodiment. Similar to the processes of the first embodiment, the processes shown in FIGS. 2A to 2Q are executed to form up to the third metal wiring. FIG. 3A shows the process corresponding to that shown in FIG. 2R.

As shown in FIG. 3A, a TEOS silicon oxide film 43 is formed on the third wiring pattern, for example, to a thickness of 15000 nm by CVD to completely bury spaces between electrode wirings. CMP polishes the TEOS silicon oxide film and is stopped at the surface TiN layer of the third metal wirings. An alumina film 47 is formed, for example, to a thickness of 50 nm by PVD, covering the TEOS silicon oxide film 43 whose surface was planarized and made flush with the upper surfaces of the third metal wiring patterns. A silicon nitride film 45 is formed on the alumina film 47, for example, to a thickness of 500 nm by CVD. Since the alumina film 47 and silicon nitride film 45 having a function of shielding moisture and hydrogen are formed in contact with the third metal wiring pattern surface, it becomes possible to eliminate a leak path to the moisture resistant ring structure.

As shown in FIG. 3B, by using a resist pattern, an opening is formed through the silicon nitride film 45 and alumina film 47. The TiN film and Ti film of the third wiring layer are also etched. After the pad opening is formed, a photosensitive polyimide film 46 is coated, exposed and developed to form a pad opening. After the opening is patterned, heat treatment is performed in a horizontal furnace for 40 minutes at 310° C. in an N₂ atmosphere (flow rate: 100 lt/min), to cure polyimide.

According to this embodiment, in the pad opening, the pad electrode surface is surrounded by the alumina film 47 and silicon nitride film 45, and a silicon oxide film will not be exposed. A possibility that moisture and hydrogen permeate from the pad opening is reduced.

The first and second embodiments do not have a specific structure of shielding moisture and hydrogen once permeated the region lower than the first metal wiring patterns from the ferroelectric film, excepting the alumina film 17 covering the surface of the ferroelectric capacitor.

FIGS. 4A to 4E are schematic cross sectional views illustrating a semiconductor device manufacture method according to the third embodiment. First, processes are executed which are similar to those shown in FIGS. 2A to 2F of the first embodiment.

FIG. 4A shows the same structure as that shown in FIG. 2F. Namely, after the ferroelectric capacitor is formed and covered with an alumina film 17 and a silicon oxide film 18, bulk contact holes are etched by using a resist pattern RP as an etching mask.

In etching the contact holes, a first step etches down to the silicon oxide films 9 and 8 and stops at the surface of the silicon oxynitride film 7. Next, a second step etches the silicon oxynitride film 7 by changing the etching conditions.

As shown in FIG. 4B, W plugs PL11 are formed in the bulk contact holes, and an unnecessary region on the silicon oxide film 18 is removed by CMP, etch-back or the like. A pad structure area resist pattern RP is formed covering the W plugs PL11. This resist pattern RP has openings corresponding to a loop-shaped area where the pad moisture resistant ring is to be formed and an area where a moisture resistant ring is to be formed along a chip outer periphery.

As shown in FIG. 4B, by using the resist pattern RP as an etching mask, the silicon oxide film 18, alumina films 17 and 11 and silicon oxide films 9 and 8 are etched, and etching is stopped at the surface of the silicon oxynitride film 7. Of the two steps of etching the contact holes for the plugs PL11, only the first step is executed and the second step will be not executed. The silicon oxynitride film 7 is exposed on the bottoms of the contact holes. The resist pattern RP is thereafter removed.

Figure 4C:
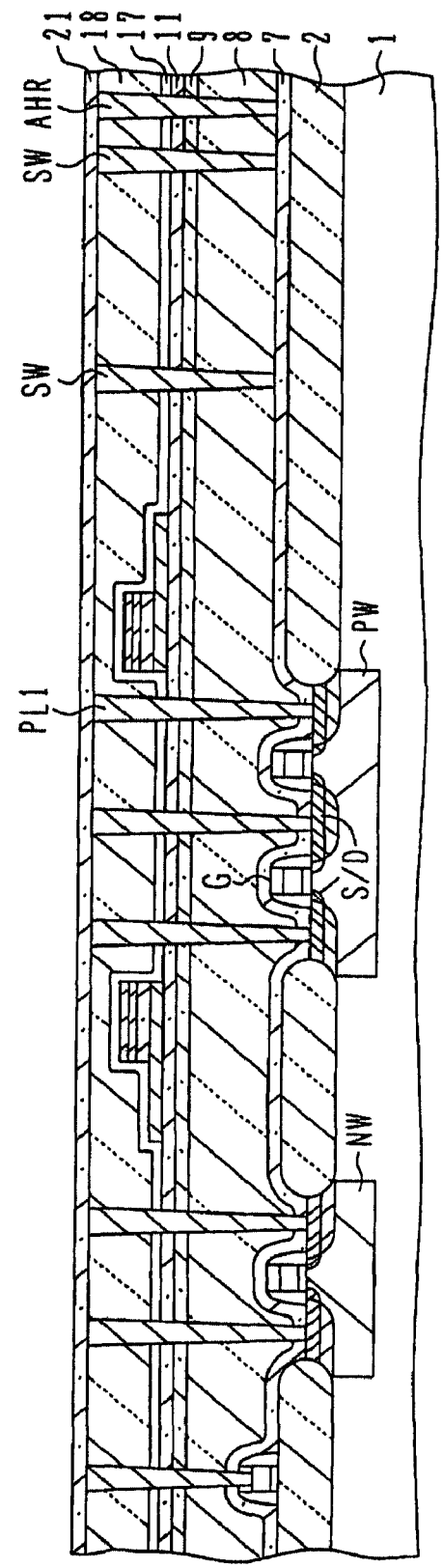

As shown in FIG. 4C, a barrier metal layer is formed in the contact holes, and a W film is buried in the contact holes by CVD to form via conductor layers SW and AHR. After an unnecessary region of the via conductor layers is removed, a silicon oxynitride film 21 is formed covering the surfaces of the via conductor layers.

Figure 4D:
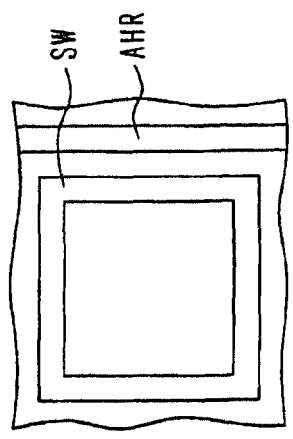

FIG. 4D is a schematic plan view showing a plan shape of the via conductor layers. A loop-shaped sealing wall SW is formed corresponding to the outer periphery of the base metal BM of the bonding pad, and a moisture resistant ring AHR is formed along the chip outer periphery. Thereafter, processes similar to the processes of the first embodiment shown in FIG. 2G and succeeding Figures are executed.

Figure 4E:
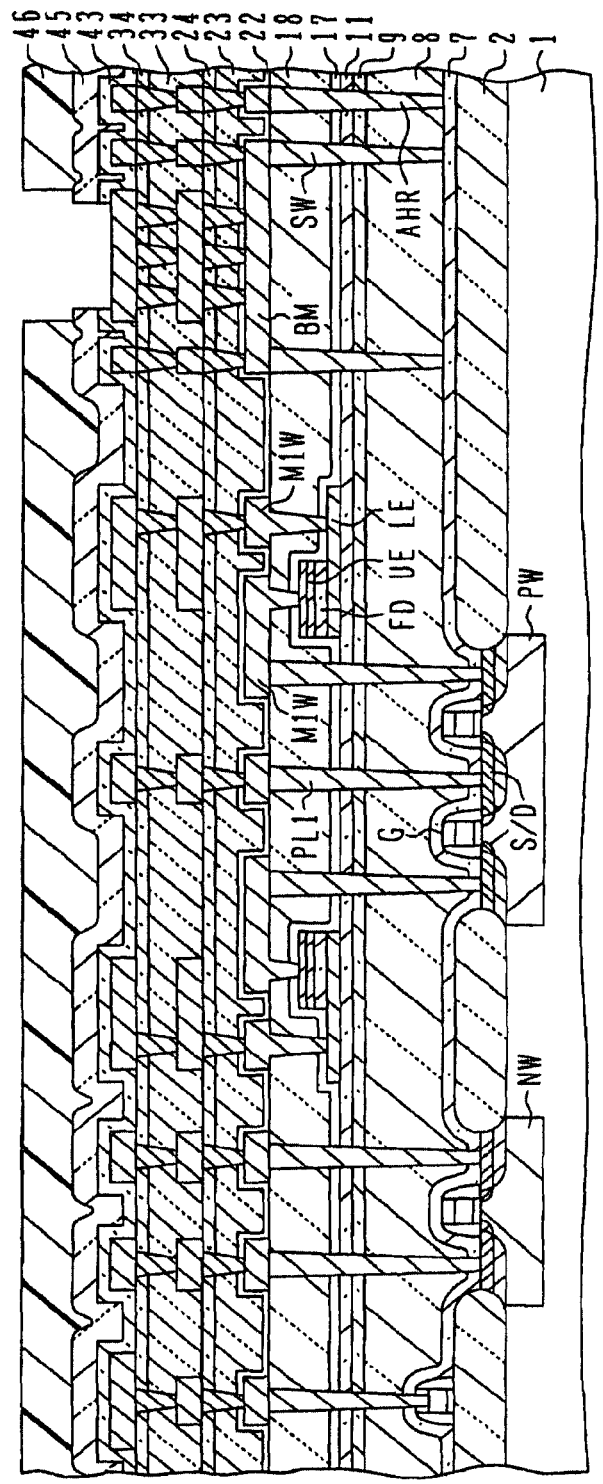

FIG. 4E is a schematic cross sectional view showing a structure of a finished semiconductor device. The loop-shaped sealing wall SW is formed under the outer periphery of the base metal BM of the laminated bonding pad structure, and reaches the surface of the silicon oxynitride film 7. A barrier structure against moisture and hydrogen is therefore formed also under the laminated bonding pad structure.

In the embodiments described above, the tubular metal member is formed on the base metal layer to form the cup-shaped sealing structure, and the laminated bonding pad structure is formed inside the tubular metal member. The barrier performance against moisture and hydrogen of the bonding pad structure can be improved further.

FIGS. 5A to 5D are schematic cross sectional views of a semiconductor device manufacture method according to the fourth embodiment.

As shown in FIG. 5A, processes similar to those of the first embodiment shown in FIGS. 2A to 2K are executed. After the ferroelectric capacitor is formed and covered with an alumina film 17, a silicon oxide film 18 and W plugs are formed, and thereafter the first metal wirings are formed and covered with an aluminum film 22 of 20 nm thick.

As shown in FIG. 5B, for example, a TEOS silicon oxide film 23 is formed on the alumina film 22 to a thickness of 2600 nm by CVD, and its surface is planarized by CMP. After the surface of the silicon oxide film 23 is nitridized, another TEOS silicon oxide film 24 is formed to a thickness of about 100 nm by CVD.

After the surface of the silicon oxide film 24 is nitridized, an alumina film 25 is formed to a thickness of about 250 nm by PVD such as sputtering. If necessary, thermal annealing is performed in an oxidizing atmosphere, and a TEOS silicon oxide film 26 is formed on the alumina film 25 to a thickness of about 100 nm by CVD. The surface of the silicon oxide film 26 is nitridized. In this manner, a relatively thick alumina film is buried in the interlevel insulating film on the first metal wirings. The aluminum film functions as a shielding film against moisture and hydrogen. However, since a dielectric constant of alumina is higher than that of silicon oxide, if an alumina film is formed at a level contacting the wiring patterns, a parasitic capacitance of wirings becomes high.

Figure 5C:
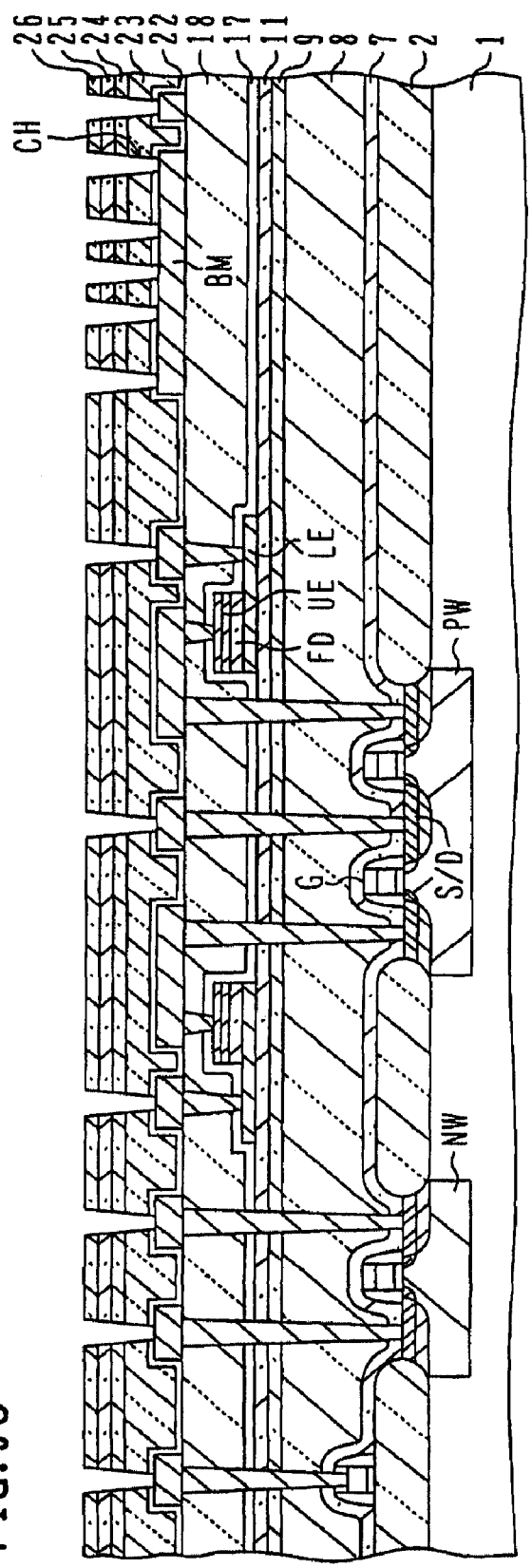

As shown in FIG. 5C, contact holes corresponding to those shown in FIG. 2M are formed. As compared to the process shown in FIG. 2M, a different point is that the alumina film 25 is contained in the layer to be etched.

Figure 5D:
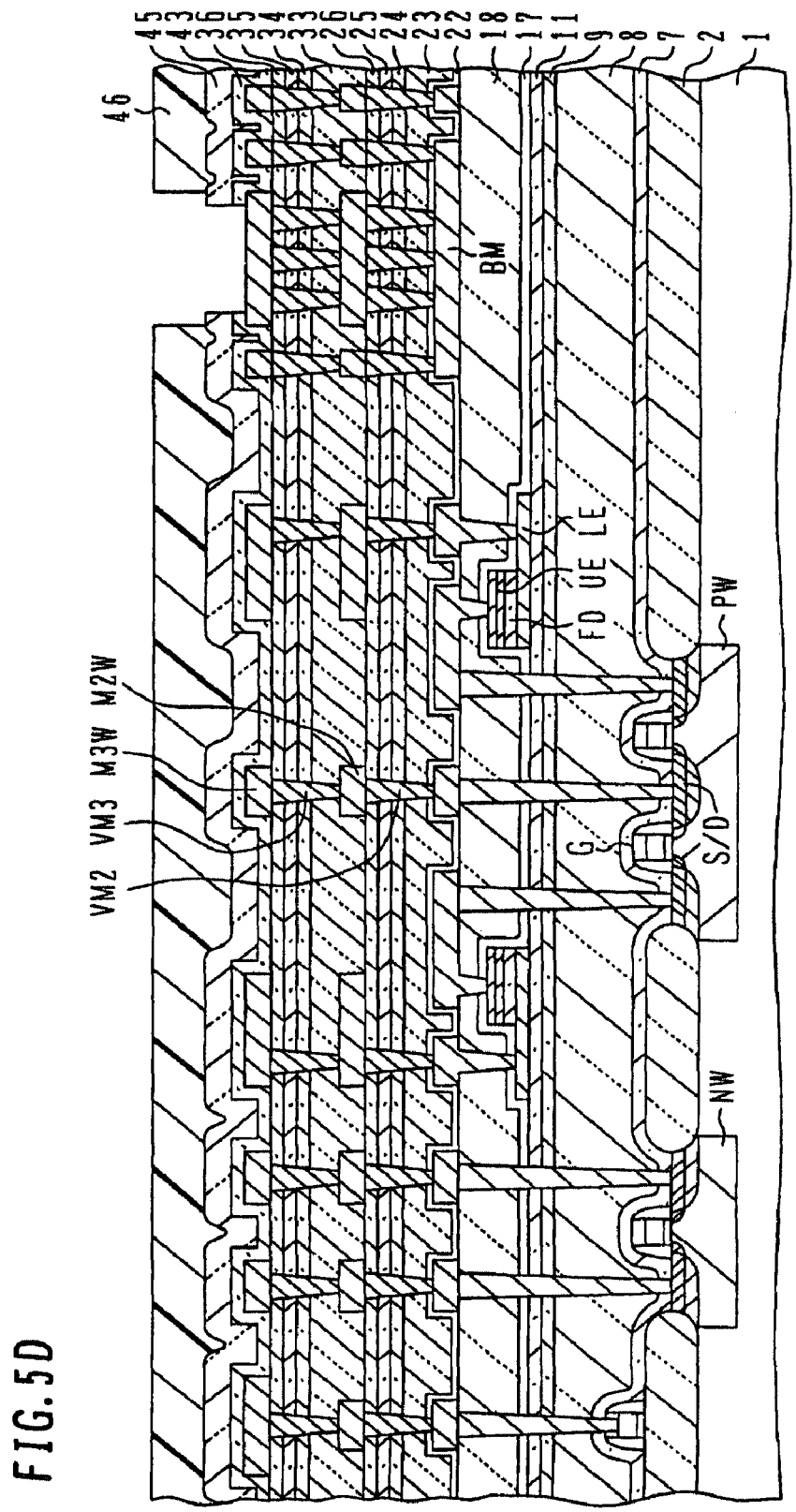

As shown in FIG. 5D, a via conductor layer VM2 is buried in the contact holes, an unnecessary region is removed and thereafter second metal wiring patterns M2W are formed. By performing the processes similar to those shown in FIGS. 5B and 5C, silicon oxide films 33 and 34, an alumina film 35 and a silicon oxide film 36 are deposited covering the second metal wiring patterns M2W, and a via conductor layer VM3 is again buried. After an unnecessary conductor layer is removed, third metal wiring patterns M3W are formed. In the bonding pad area, similar to the first embodiment, a laminated bonding pad structure is formed on the base metal BM, and a loop-shaped wall is formed at the periphery of the base metal BM. Thereafter, similar to the processes of the first embodiment, a silicon oxide film 43 is formed and a silicon nitride film 45 is formed on the silicon oxide film 43. After an opening for the pad electrode is formed, a polyimide film 46 is coated and an opening is formed in the pad area. Although the alumina film 47 above the bonding pad is omitted, two alumina films 25 and 35 are formed at the positions crossing the via conductors of the laminated pad structure, and the shielding performance for moisture and hydrogen is reinforced.

FIGS. 6A to 6F show schematically the structure of a semiconductor device according to the fifth embodiment.

Figure 6A:
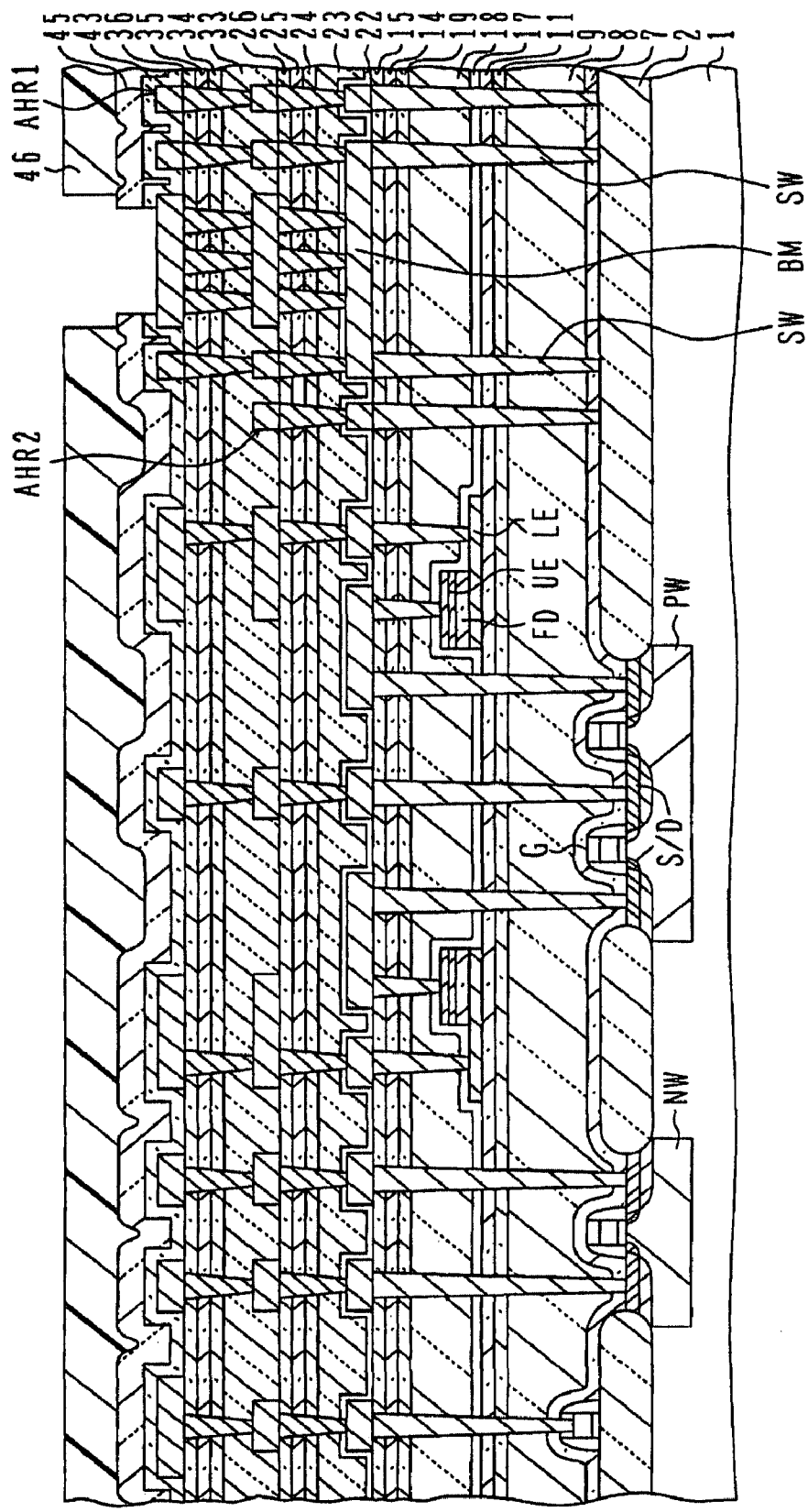
FIGS. 6A to 6F are a cross sectional view and plan views of a semiconductor substrate illustrating main processes of a semiconductor device manufacture method according to a fourth embodiment.

As shown in FIG. 6A, similar to the structure of the fourth embodiment shown in FIG. 4E, a sealing wall SW and a moisture resistant ring AHR1 are formed in the via conductor layer under the first metal wiring patterns M1W, and an alumina film 14 is inserted at the position crossing the via conductors and covered with a silicon oxide film 15. Similar to the structure of the fourth embodiment shown in FIG. 5D, alumina films 25 and 35 are inserted in the interlevel insulating film above the first metal wiring patterns M1W.

Further, also in the area inner than the bonding pad, an inner chip moisture resistant ring AHR2 having the structure similar to that of the chip moisture resistant ring AHR1 is formed. The inner chip moisture resistant ring AHR2 is cut off in an area where a bonding pad lead wiring exists.

Figure 6D:
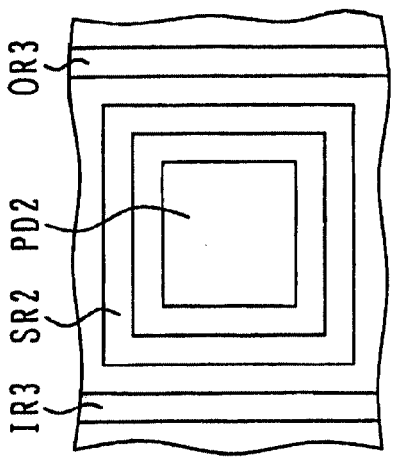
Figure 6F:
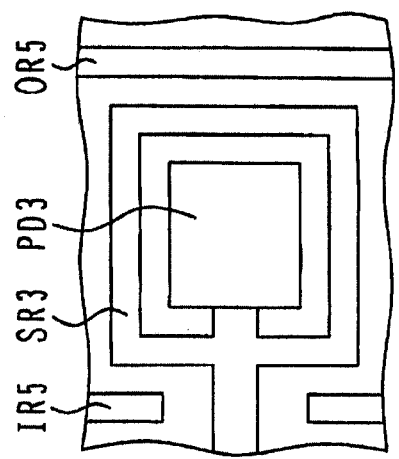
Figure 6C:
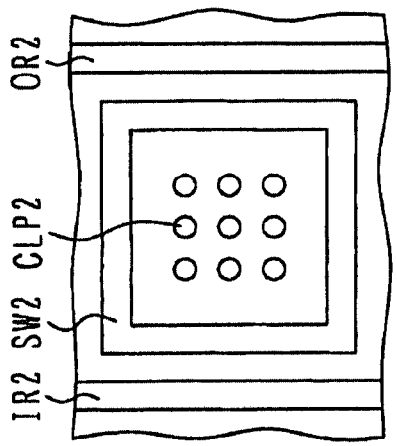
Figure 6E:
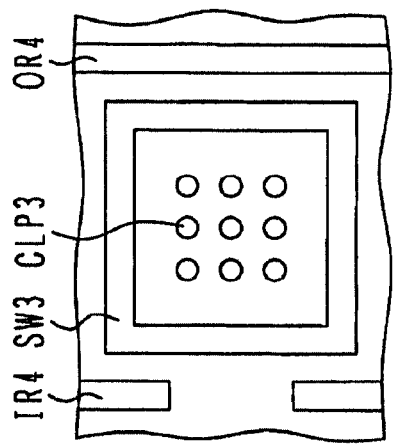
Figure 6B:
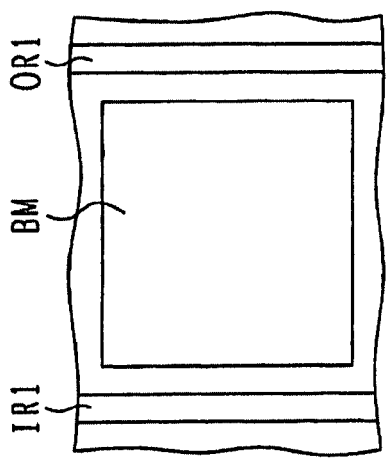

FIG. 6B is a schematic plan view of the bonding pad structure of the first metal wiring layer. Wiring patterns IR1 and OR1 constituting the inner chip moisture resistant ring AHR2 and outer chip moisture resistant ring AHR1 are formed on the right and left sides of the base metal BM.

FIG. 6C shows schematically the bonding pad structure in the via conductor layer on the first wiring pattern. Connection plugs CLP2 having the same structure as that of the W plugs are formed connecting upper and lower pad patterns of the bonding pad structure, and a sealing wall SW2 surrounds the connection plugs CPL2. Wall members IR2 and OR2 constituting the moisture resistant rings are further formed in areas inner and outer than the sealing wall.

FIG. 6D shows schematically the bonding pad structure in the second wiring layer. A pad pattern PD2 is formed in a central area, and a sealing pattern SR2 is formed surrounding the pad pattern. Members OR3 and IR3 constituting moisture resistant rings are further formed in areas inner and outer than the bonding pad.

FIG. 6E shows schematically the bonding pad structure in the via conductor layer on the second wiring patterns. Similar to the structure shown in FIG. 6C, connection plugs CPL3 are formed in the pad pattern PD area, and a sealing wall SW3 is disposed surrounding the connection plugs. A wall member OR4 of the chip moisture resistant wall AHR1 is formed in an area outer than the bonding pad. A wall member IR4 of the inner chip moisture resistant ring is cut off in an area inner than the bonding pad to prevent a short circuit with a pad lead wiring.

FIG. 6F shows schematically the bonding pad structure in the third metal wiring layer as the uppermost wiring layer. A pad pattern PD3 is formed in a central area, and a sealing pattern SR3 is formed surrounding the pad pattern, this structure being similar to that shown in FIG. 6D. Further formed are a wiring portion connecting the pad pattern PD3 and a sealing pattern SR3 and a wiring pattern led from the sealing pattern SR3 to the circuit area. A member OR5 of the outer chip moisture resistant ring is disposed in an area outer than the bonding pad. A wiring pattern IR5 of the inner chip moisture resistant ring is cut off in an area inner than the bonding pad to prevent a short circuit with a pad lead wiring.

In the structure shown in FIG. 6A, although the circuit area and bonding pad are connected by leading the uppermost wiring pattern of the bonding pad structure to the circuit area, the circuit area may be connected by leading another wiring pattern to the external. In this case, the wiring patterns shown in FIG. 6F are disposed in an area connecting to the circuit area, and the upper and lower via conductors have the structure shown in FIG. 6E.

FIG. 7 shows a modification of the above-described embodiments. As compared to the structure shown in FIG. 6A, a W plug PL11 is formed under the lower electrode of the ferroelectric capacitor which is formed on the W plug, and a contact to the upper electrode is formed from the upper side. A stack type capacitor is formed by using upper and lower contacts to the upper and lower electrodes of the ferroelectric capacitor. The other structures are similar to those of the fifth embodiment shown in FIG. 6A, excepting that the inner chip moisture resistant ring is not formed. A stack type capacitor may be adopted in the other embodiments.

In the embodiments described above, the multilevel wiring structure is formed by the via conductor layer of W plugs and the like and the Al wiring. The multilevel wirings may be formed by damascene wirings of Cu.

Figure 8:
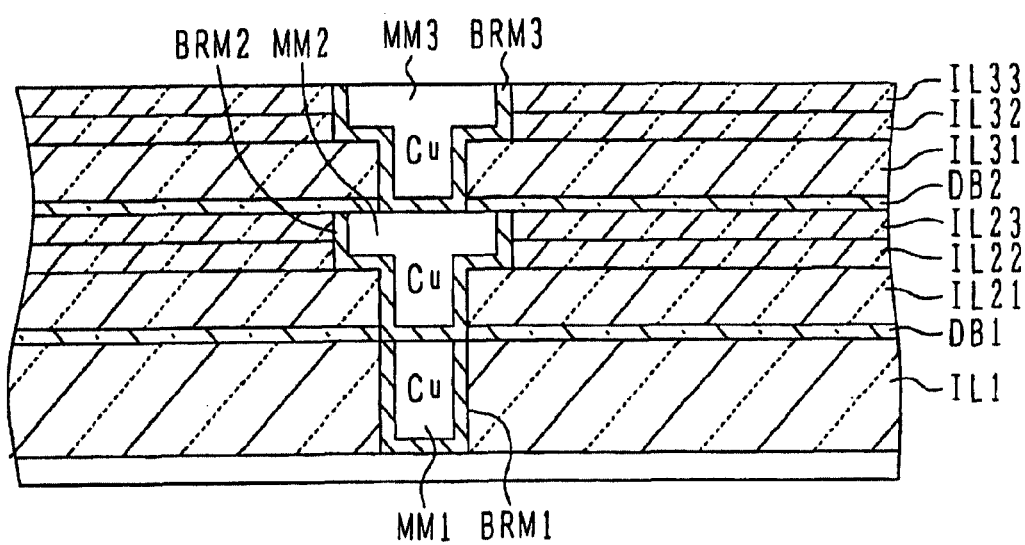
FIG. 8 is a cross sectional view showing another modification.

FIG. 8 shows a modification using damascene wirings. A trench is formed in an interlevel insulating film IL1, a barrier metal layer BRM1 is deposited, a main wiring layer MM1 of Cu is formed burying the trench, and the unnecessary region is removed to form a single damascene structure. After the single damascene structure is formed, a diffusion barrier layer DB1 of silicon nitride, silicon carbide or the like is formed on the single damascene structure. Sequentially stacked on this diffusion barrier layer are a silicon oxide film IL21 by CVD, a silicon oxide film IL22 by spin on glass (SOG) and a silicon oxide film IL23 by CVD. Since the silicon oxide film by CVD and the silicon oxide film by SOG have different etching characteristics, etching can be stopped at the interface therebetween.

A wiring pattern from the surface to bottom of the SOG silicon oxide film IL22 is formed by etching, and a via hole is formed through the underlying silicon oxide film IL21 by etching. The via hole may be formed first by etching, and then the wiring trench may be formed by etching. After a barrier metal layer BRM2 is formed, the trench is buried with a main wiring layer MM2 of Cu or the like, and an unnecessary region is removed. After the dual damascene is formed in this manner, the surface is covered with a copper diffusion preventive film DB2. Interlevel insulating films IL31, IL32 and 1L33 having a similar structure to that described above are formed to form a dual damascene structure including a barrier metal layer BRM3 and a main wiring layer MM3. The wiring patterns in the structures described earlier may be replaced with damascene wiring patterns to replace the via conductors with the damascene via conductors.

When an aluminum film is buried in an interlevel insulating film, it is preferable that the alumina layer is disposed at the position not crossing the wiring patterns but crossing via conductors.

The present invention has been described in connection with the preferred embodiments. The invention is not limited only to the above embodiments. For example, although alumina is used as the material of a barrier layer having the shielding function for moisture and hydrogen, titanium oxide may be used. A thickness of titanium oxide is preferably 20 to 100 nm. It will be apparent to those skilled in the art that other various modifications, improvements, combinations, and the like can be made.

What are claimed are:

1. A semiconductor device comprising:
a semiconductor substrate;
a circuit portion formed on said semiconductor substrate and including a plurality of semiconductor elements;
insulating lamination formed above said semiconductor substrate and covering said circuit portion;
multilevel wiring structure formed in said insulating lamination and including wiring patterns and via conductors; and
pad electrode structure formed above said semiconductor substrate and connected to said multilevel wiring structure, said pad electrode structure including pad wiring patterns in a plurality of levels and pad via conductors interconnecting said pad wiring patterns, at least said pad wiring pattern in an uppermost level including a pad pattern and a sealing pattern surrounding said pad pattern in a loop shape with some distance from said pad pattern, at least one of the pad wiring patterns in a level other than the uppermost level having a continuous extended pad pattern of a size overlapping said sealing pattern, said pad via conductors including a plurality of columnar via conductors disposed in an area overlapping said pad pattern and a loop-shaped wall portion disposed in an area overlapping said sealing pattern, said pad pattern of said pad wiring pattern or said extended pad pattern and said columnar via conductors constituting a laminated bonding pad, and said extended pad pattern, said sealing pattern and said loop-shaped wall portion surrounding said laminated bonding pad to form a cup-shaped moisture resistant structure having a function of shielding moisture and hydrogen.

2. The semiconductor device according to claim 1, wherein said pad wiring pattern in a lowermost level has said extended pad pattern, and said loop-shaped wall portion and said pad wiring pattern in the lowermost level constitute a bottom-closed structure.

3. The semiconductor device according to claim 2, wherein at least one of said pad wiring patterns in a level other than the uppermost and lowermost levels has said extended pad pattern.

4. The semiconductor device according to claim 2, wherein said pad wiring patterns in levels other than the lowermost level have said pad pattern and said sealing pattern.

5. The semiconductor device according to claim 1, wherein said pad wiring pattern in a level other than the uppermost level is formed in a same level as said wiring pattern, and said pad via conductor in a level other than the uppermost level is formed in a same level as said via conductor.

6. The semiconductor device according to claim 1, wherein said pad wiring pattern in the uppermost level is made of aluminum, and said pad via conductor in the uppermost level is made of tungsten.

7. The semiconductor device according to claim 1, further comprising a peripheral chip moisture resistant ring formed through said insulating lamination along an outer periphery of said semiconductor substrate in an area outer than said pad electrode structure.

8. The semiconductor device according to claim 1, wherein:
said insulating lamination includes a lower protective film of silicon nitride or silicon oxynitride formed on said semiconductor substrate and covering said semiconductor elements; and
the semiconductor device further comprises:
lower via conductor connected to each of said semiconductor elements and extending upward through said lower protective film; and
lower loop-shaped wall portion connected to a loop-shaped peripheral region in the lower surface of said pad wiring pattern in the lowermost layer, and extending downward and reaching said lower protective film.

9. The semiconductor device according to claim 8, wherein said lower via conductor and said lower loop-shaped wall portion are formed in a same level.

10. The semiconductor device according to claim 1, further comprising a ferroelectric capacitor including a lower electrode, a ferroelectric oxide film and an upper electrode and formed above said semiconductor substrate, said multilevel wiring structure is disposed above said ferroelectric capacitor.

11. The semiconductor device according to claim 10, wherein said insulating lamination includes a lower protective film under said ferroelectric capacitor, said lower protective film having a function of shielding moisture and hydrogen.

12. The semiconductor device according to claim 11, wherein said lower protective film is made of aluminum oxide or titanium oxide.

13. The semiconductor device according to claim 1, wherein said insulating lamination includes a first insulating barrier layer having a function of shielding moisture and hydrogen and disposed at a first level crossing said columnar via conductors.

14. The semiconductor device according to claim 13, wherein said insulating lamination includes a second insulating barrier layer disposed at a second level different from said first level, crossing said columnar via conductors, and having a function of shielding moisture and hydrogen.

15. The semiconductor device according to claim 13, wherein said first insulating barrier layer is made of aluminum oxide or titanium oxide.

16. The semiconductor device according to claim 15, wherein a thickness of said first insulating barrier layer is in a range from 20 to 100 nm.

17. The semiconductor device according to claim 1, wherein said insulating lamination includes a third insulating barrier layer having a function of shielding moisture and hydrogen and contacting an upper surface of said pad wiring pattern in the uppermost layer.

18. The semiconductor device according to claim 1, wherein at least one of said pad wiring patterns further comprises a first wiring portion connecting said pad pattern and said sealing pattern, and a second wiring portion extending outward from said sealing pattern, or a third wiring portion extending outward from said extended pad pattern.

19. The semiconductor device according to claim 18, further comprising an inner chip moisture resistant ring formed in an area inner than said pad electrode structure in a loop shape through said insulating lamination, and cut off in an area crossing said second or third wiring portion.

20. A method for manufacturing a semiconductor device, comprising steps of:

forming a plurality of semiconductor elements in each chip area of a semiconductor substrate, which includes a plurality of chip areas;

forming a lower interlevel insulating film on said semiconductor substrate, said lower interlevel insulating film covering said plurality of semiconductor elements;

forming a ferroelectric capacitor on said lower interlevel insulating film;

forming an insulating lamination on said lower interlevel insulating film, said insulating lamination covering said ferroelectric capacitor;

forming a multilevel wiring structure disposed in said insulating lamination; and forming a pad electrode structure disposed above said semiconductor substrate and connected to said multilevel wiring structure, said pad electrode structure containing, in said insulating lamination, a plurality of pad wiring patterns and pad via conductors interconnecting said pad wiring patterns, at least said pad wiring patterns in an uppermost level including a pad pattern and a sealing pattern surrounding said pad pattern in a loop shape with some distance from said pad pattern, at least one pad wiring pattern in a level other than the uppermost level having a continuous extended pad pattern of a size overlapping said sealing pattern, said pad via conductors including a plurality of columnar via conductors disposed in an area overlapping said pad pattern and a loop-shaped wall portion disposed in an area overlapping said sealing pattern, said pad pattern of said pad wiring pattern or said extended pad pattern and said columnar via conductors constituting a laminated bonding pad, and said extended pad pattern, said sealing pattern and said loop-shaped wall portion surrounding said laminated bonding pad to form a cup-shaped moisture resistant structure having a function of shielding moisture and hydrogen.

* * * * *